US007892860B2

(12) United States Patent
Ohmi et al.

(10) Patent No.: US 7,892,860 B2
(45) Date of Patent: Feb. 22, 2011

(54) SEMICONDUCTOR LASER CHIP AND METHOD OF FORMATION THEREOF

(75) Inventors: Susumu Ohmi, Mihara (JP); Katsuhiko Kishimoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 377 days.

(21) Appl. No.: 12/078,258

(22) Filed: Mar. 28, 2008

(65) Prior Publication Data

US 2008/0240188 A1  Oct. 2, 2008

(30) Foreign Application Priority Data

Mar. 29, 2007 (JP) .............................. 2007-086994

(51) Int. Cl.
*H01L 21/00* (2006.01)

(52) U.S. Cl. ................... 438/8; 438/7; 438/16; 438/39; 257/E21.528

(58) Field of Classification Search ....... 438/7, 438/8, 39, 718; 257/E21.528
See application file for complete search history.

(56) References Cited

U.S. PATENT DOCUMENTS 5,436,923 A  7/1995 Nagai 7,306,696 B2 * 12/2007 Lian et al. .............. 156/345.25
2005/0042777 A1 *  2/2005 Boger et al. ................... 438/8
2006/0094141 A1    5/2006 Tsunoda et al.

FOREIGN PATENT DOCUMENTS

JP   2008-226875   9/2008

OTHER PUBLICATIONS

M. Jost et al.: "Ridge Formation of AlGaAs GRINSCH Lasers by $Cl_2$ Reactive Ion Etching", IEEE Photonics Technology Letters, vol. 2, No. 10, Oct. 1990.

* cited by examiner

*Primary Examiner*—Zandra Smith
*Assistant Examiner*—Christy L Novacek
(74) *Attorney, Agent, or Firm*—Harness, Dickey & Pierce, P.L.C.

(57) ABSTRACT

A method for forming a semiconductor laser chip is provided that can suppress layer discontinuity and simultaneously reduce fabrication variations in the light radiation angle in the horizontal direction. The method includes a step of forming, on an n-type GaAs substrate, a semiconductor element layer composed of a plurality of semiconductor layers including an etching marker layer, a step of forming, in a contact layer in the semiconductor element layer, a depressed portion having a depth not reaching the etching marker layer, and a step of forming a ridge portion by etching the semiconductor element layer by dry etching while monitoring, with laser light, the etching depth in the bottom region of the depressed portion.

10 Claims, 14 Drawing Sheets

SEMICONDUCTOR LASER CHIP AND METHOD OF FORMATION THEREOF

This nonprovisional application claims priority under 35 U.S.C. §119(a) on Patent Application No. 2007-086994 filed in Japan on Mar. 29, 2007, the entire contents of which are hereby incorporated by reference.

BACKGROUND OF THE INVENTION

1. Field of the Invention

The present invention relates to a semiconductor laser chip, and to a method of formation thereof. More specifically, the invention relates to a semiconductor laser chip provided with a ridge portion, and to a method of formation thereof.

2. Description of Related Art

Compound semiconductor laser chips are generally provided with a stripe-shaped (long, narrow) ridge portion as a waveguide structure. The ridge portion is formed by etching a semiconductor element layer composed of a plurality of semiconductor layers laminated on a substrate.

In this case, the etching depth affects the light confinement in the horizontal-lateral direction in the light waveguide, and therefore, in etching for forming the ridge portion, accuracy of the controllability of etching is strongly demanded. It should be noted that, if the controllability of etching for forming the ridge portion is low, and thus the distance from the etching bottom surface to the active layer at the side of the ridge portion varies, the light confinement effect in the horizontal-lateral direction at the side of the ridge portion varies. And if the light confinement effect in the horizontal-lateral direction at the side of the ridge portion varies, disadvantageously, the controllability of the light radiation angle in the horizontal direction in the semiconductor laser chip lowers.

For this reason, there have conventionally been proposed methods for improving the controllability of etching depth in etching for forming the ridge portion (see, for example, Non-patent Document 1).

Non-patent Document 1 mentioned above discloses a method according to which, in forming a semiconductor element layer, an etching marker layer is formed beforehand at the position (end position) at which to stop etching, and laser light is shone on the surface of the semiconductor element layer so that, while the reflected light is being monitored, the semiconductor element layer is etched by dry etching until, at the time point that the etching marker layer is detected, etching is stopped.

It should be noted that, in the method disclosed in Non-patent Document 1 mentioned above, when the wavelength of the laser light shone on the semiconductor element layer is set shorter than the absorption edge of the etching marker layer, the interference behavior of the reflected light is strongly affected by the light absorption at the etching marker layer. More specifically, when laser light is shone on the semiconductor element layer having a plurality of semiconductor layers laminated, due to the differences in index of refraction among the semiconductor layers, interference occurs in the reflected light; when the etching depth reaches the etching marker layer, the amount of light absorbed by the etching marker layer changes, and accordingly the interference behavior of the reflected light changes. Thus, by detecting a change in the interference behavior of the reflected light, it is possible to check whether or not the etching depth has reached the end position (etching marker layer).

Non-patent Document 1: Photonics Technology Letters, Vol. 2, p. 697

With the method disclosed in Non-patent Document 1 mentioned above, since the end position of etching is detected based on a change in the interference behavior of the reflected light, when a change in interference behavior is detected, the etching depth has reached the etching marker layer. Moreover, to suppress absorption by the etching marker layer of the light produced at the active layer, the thickness of the etching marker layer is generally set as small as 50 nm or less. Thus, after the end position of etching is detected, the etching marker layer is etched in an extremely short time. Thus, even when etching is stopped on detection of a change in the interference behavior of the reflected light, as shown in FIG. 25, the semiconductor element layer is etched beyond the etching marker layer 400 into the semiconductor layer 401 under it.

On the other hand, in a case where a semiconductor element layer is etched by dry etching, after formation of the ridge portion, chemical etching (wet etching) is generally performed to remove reaction products produced during etching and parts damaged by etching. In a case where the ridge portion is formed by the method disclosed in Non-patent Document 1 mentioned above, as described above, the semiconductor element layer is etched beyond the etching marker layer 400 into the semiconductor layer 401 under it; thus, when chemical etching is performed after formation of the ridge portion, due to the difference between the etching speed at the etching marker layer and that at the semiconductor layer around it, after the completion of etching, inconveniently, as shown in FIG. 26, the etching marker layer 400 protrudes from the side surfaces of the ridge portion 402 or, as shown in FIG. 27, the etching marker layer 400 recedes from the side surfaces of the ridge portion 402. Inconveniently, due to such protrusion or recession of the etching marker layer, surface irregularities are produced in the side surfaces of the ridge portion. As a result, when, in a step after formation of the ridge portion, an insulating layer or an electrode layer is formed on the side surfaces of the ridge portion, disadvantageously, those surface irregularities in the side surfaces of the ridge portion produce layer discontinuity in the insulating layer or electrode layer formed.

SUMMARY OF THE INVENTION

The present invention has been made to overcome the inconveniences and disadvantages discussed above, and it is an object of the invention to provide a method for forming a semiconductor laser chip that can suppress layer discontinuity and simultaneously reduce fabrication variations in the light radiation angle in the horizontal direction.

It is another object of the invention to provide a semiconductor laser chip that can suppress layer discontinuity and simultaneously reduce fabrication variations in the light radiation angle in the horizontal direction.

To achieve the above objects, according to a first aspect of the invention, a method for forming a semiconductor laser chip includes: a step of forming, on a substrate, a semiconductor element layer composed of a plurality of semiconductor layers including an etching marker layer; a step of forming, in a predetermined region in the semiconductor element layer, a depressed portion having a predetermined depth not reaching the etching marker layer; and a step of forming a ridge portion in the semiconductor element layer by etching the semiconductor element layer by dry etching while monitoring the etching depth in the bottom region of the depressed portion. It should be noted that, in the invention, an etching marker layer is a semiconductor layer that allows detection of the end point of etching.

In this method for forming a semiconductor laser chip according to the first aspect, as described above, a depressed portion having a predetermined depth not reaching the etching marker layer is formed in the semiconductor element layer, and the semiconductor element layer is etched while the etching depth is being monitored in the bottom region of the depressed portion. Thus, even when etching is stopped after the etching depth in the bottom region of the depressed portion is detected to have reached the etching marker layer, it is possible to prevent the etching depth in the region where the depressed portion is not formed from going beyond the etching marker layer. Specifically, when the etching marker layer is set to have an extremely small thickness, in the bottom region of the depressed portion, even when etching is stopped after the etching marker layer is detected, etching proceeds beyond the etching marker layer into the semiconductor layer under it. However, at the time point that the etching marker layer is detected in the bottom region of the depressed portion, in the region where the depressed portion is not formed, the etching depth has not reached the etching marker layer yet. Thus, even when etching is stopped after the etching marker layer is detected in the bottom region of the depressed portion, in the region where the depressed portion is not formed, it is possible to suppress etching beyond the etching marker layer into the semiconductor layer under it.

In this way, by forming a ridge portion of a semiconductor laser chip in a region where no depressed portion is formed, it is possible to form a ridge portion that is formed, even when etching is stopped after an etching marker layer is detected, without etching beyond the etching marker layer. Thus, even when, after the ridge portion is formed, chemical etching (wet etching) is performed to remove reaction products produced during dry etching and parts damaged by etching, in the region where the ridge portion is formed and where the depressed portion is not formed, etching does not proceed beyond the etching marker layer into the semiconductor layer under it. This helps suppress the inconvenience of, due to the differences between the etching speed at the etching marker layer and that at the semiconductor layer around it, the etching marker layer protruding from the side surfaces of the ridge portion or receding from the side surfaces of the ridge portion. As a result, it is possible to suppress the inconvenience of, due to protrusion or recession of the etching marker layer, surface irregularities being produced in the side surfaces of the ridge portion. Thus, when, in a step after formation of the ridge portion, an insulating layer or an electrode layer is formed on the side surfaces of the ridge portion, it is possible to suppress layer discontinuity in the insulating layer or electrode layer ascribable to surface irregularities in the side surfaces of the ridge portion. It should be noted that, by suppressing layer discontinuity in the insulating layer or electrode layer, it is possible, in the semiconductor laser chip formed, to suppress layer-discontinuity-induced inconveniences of current injection inhibition, current leakage, etc.

Moreover, according to the first aspect of the invention, a semiconductor element layer including an etching marker layer is formed on a substrate, and the semiconductor element layer is etched while the etching depth is being monitored in the bottom region of a depressed portion. Thus, by stopping etching after the etching marker layer is detected in the bottom region of the depressed portion, it is possible to stop etching at a fixed position. This makes it possible, by forming the etching marker layer at the position where to stop etching, to stop etching accurately at a desired position, and thus to suppress variations in the etching depth. That is, it is possible to enhance the controllability of etching. In this way, it is possible to adjust accurately to a desired distance the distance from the etching bottom surface to the active layer at the side of the ridge portion, and thus to suppress variations in the light confinement effect in the horizontal-lateral direction at the side of the ridge portion. As a result, it is possible to reduce fabrication variations in the light radiation angle in the horizontal direction in the semiconductor laser chip.

In the above-described method for forming a semiconductor laser chip according to the first aspect of the invention, preferably, the step of forming the ridge portion includes: a step of detecting, by an optical method, that the depth of the depressed portion has reached the etching marker layer; and a step of stopping etching at a predetermined time point after detecting that the depth of the depressed portion has reached the etching marker layer but before the etching depth in the region of the semiconductor element layer where the depressed portion is not formed reaches the etching marker layer. With this configuration, by an optical method, it is possible to detect that the depth of the depressed portion has reached the etching marker layer. Moreover, by stopping etching at a predetermined time point after detecting that the depth of the depressed portion has reached the etching marker layer but before the etching depth in the region of the semiconductor element layer where the depressed portion is not formed reaches the etching marker layer, it is possible to adjust more accurately to a predetermined depth not going beyond the etching marker layer the etching depth in the region where the depressed portion is not formed (the etching depth at the side of the ridge portion). This makes it possible to easily reduce variations in the etching depth in the region where the depressed portion is not formed. That is, it is possible to easily enhance the controllability of etching. This makes it possible to form the ridge portion accurately without etching the etching marker layer itself, and thus it is possible to easily suppress layer discontinuity and simultaneously reduce fabrication variations in the light radiation angle in the horizontal direction.

In the above-described method for forming a semiconductor laser chip according to the first aspect of the invention, preferably, the step of forming the depressed portion includes: a step of forming a mask layer on the region of the semiconductor element layer where the depressed portion is not formed and etching the semiconductor element layer with the mask layer serving as a mask. With this configuration, by etching the semiconductor element layer with the mask layer serving as a mask, it is possible to easily form the depressed portion in the semiconductor element layer.

In this case, the step of etching the semiconductor element layer with the mask layer serving as a mask may include: a step of etching the semiconductor element layer by dry etching.

In the above-described configuration in which a mask layer is formed on the semiconductor element layer, preferably, the step of etching the semiconductor element layer with the mask layer serving as a mask includes: a step of etching the semiconductor element layer by wet etching. With this configuration, by use of an etchant fluid that only etches, of all the semiconductor layers composing the semiconductor element layer, the particular ones in which the depressed portion is formed, it is possible to stop etching when those particular semiconductor layers have been etched. Thus, by adjusting to the depth of the depressed portion the thickness of the particular semiconductor layers etched with the etchant fluid, even if the speed of etching for forming the depressed portion varies, it is possible to adjust accurately to a predetermined depth the depth of the depressed portion formed in the semiconductor element layer. This makes it possible to reduce variations in the depth of the depressed portion, and thus, in the etching for forming the ridge portion, by stopping etching at a predetermined time point after the etching marker layer is detected in the bottom region of the depressed portion, it is also possible to reduce variations in the etching depth in the region where the depressed portion is not formed (the etching depth at the side of the ridge portion). This makes it possible to easily enhance the controllability of etching in the region where the depressed portion is not formed, and thus it is possible to easily form the ridge portion more accurately without etching the etching marker layer itself. As a result, it is possible to more easily suppress layer discontinuity and simultaneously reduce fabrication variations in the light radiation angle in the horizontal direction.

In this case, preferably, the step of forming the depressed portion further includes: a step of, prior to the step of etching the semiconductor element layer by wet etching, etching the semiconductor element layer by dry etching. With this configuration, when the semiconductor element layer is etched by wet etching, it is possible to suppress exfoliation at the interface between the mask layer and the semiconductor element layer, and thus it is possible to form the depressed portion more accurately.

In the above-described configuration in which the semiconductor element layer is etched by dry etching, preferably, the mask layer is formed of photosensitive resin, and the step of etching the semiconductor element layer with the mask layer serving as a mask includes: a step of removing the mask layer by ashing using radical oxygen. With this configuration, the step for removing the mask layer can be performed in a dry etching machine (vacuum machine), and thus the series of steps including formation of the depressed portion, removal of the mask layer, and formation of the ridge portion can all be performed continuously in a dry etching machine (vacuum machine). Performing the whole processing in a single vacuum machine in this way helps shorten the processing time. Moreover, performing the series of steps continuously in a dry etching machine (vacuum machine) helps reduce the occasion of the semiconductor element layer being exposed to the atmosphere, and thus helps suppress formation of an oxide film on the surface of the semiconductor element layer. In this way, it is possible to suppress the inconvenience of the fabrication yields of the semiconductor element layer lowering due to formation of an oxide film on the surface of the semiconductor element layer. Moreover, removing the mask layer by ashing using radical oxygen, as opposed to removing the mask layer by a wet process, helps suppress deposition of minute amounts of residues on the surface of the semiconductor element layer. Thus, in the etching process for forming the ridge portion, it is possible to suppress the inconvenience of the flatness of the surface of the semiconductor element layer worsening due to such residues. This too helps suppress lowering of the fabrication yields of the semiconductor laser chip.

In the above-described method for forming a semiconductor laser chip according to the first aspect of the invention, preferably, the step of forming the ridge portion includes: a step of, after etching the semiconductor element layer by dry etching, further etching the semiconductor element layer by wet etching. With this configuration, when the semiconductor element layer is etched by wet etching, by use of an etchant fluid that does not etch the etching marker layer, it is possible to stop, at the top surface of the etching marker layer, the etching for forming the ridge portion. That is, in the step for forming the ridge portion, it is possible to form the etching bottom surface at the side of the ridge portion at the top surface of the etching marker layer. Thus, by forming the etching marker layer at a desired position, it is possible to more easily adjust to a desired depth the etching depth at the side of the ridge portion, and it is thereby possible to more easily reduce variations in the etching depth at the side of the ridge portion. That is, it is possible to more easily enhance the controllability of etching. This makes it possible to easily reduce fabrication variations in the light radiation angle in the horizontal direction in the semiconductor laser chip.

In the above-described method for forming a semiconductor laser chip according to the first aspect of the invention, preferably, the semiconductor element layer is formed on a semiconductor wafer, and the step of forming the depressed portion further includes: a step of forming, as the depressed portion, one or more depressed portions in the vicinity of a central part of the semiconductor wafer. With this configuration, compared with one in which the depressed portion is formed in the vicinity of an edge part of the semiconductor wafer, it is possible to control the etching-depth accurately in a case where etching is performed by dry etching. Specifically, in a case where etching is performed by dry etching, the etching depth tends to be greater in the vicinity of the edge part of the semiconductor wafer than the actual etching depth. Thus, by forming the depressed portion in the vicinity of a central part of the semiconductor wafer, that is, the region of the semiconductor wafer other than the edge part thereof, it is possible to control the etching depth accurately during formation of the ridge portion.

According to a second aspect of the invention, a semiconductor laser chip is provided with: a semiconductor element layer formed on a substrate and comprising a plurality of semiconductor layers including an etching marker layer; and a ridge portion formed by etching the semiconductor element layer. Here, the ridge portion is formed on the etching marker layer. It should be noted that, in the invention, an etching marker layer is a semiconductor layer that permits detection of the end point of etching.

In this semiconductor laser chip according to the second aspect, as described above, a ridge portion is formed on an etching marker layer. Thus, even when, after the ridge portion is formed, chemical etching (wet etching) is performed to remove reaction products produced during dry etching and parts damaged by etching, it is possible to suppress the inconvenience of, due to the differences between the etching speed at the etching marker layer and that at the semiconductor layer around it, the etching marker layer protruding from the side surfaces of the ridge portion or receding from the side surfaces of the ridge portion. As a result, it is possible to suppress the inconvenience of, due to protrusion or recession of the etching marker layer, surface irregularities being produced in the side surfaces of the ridge portion. Thus, it is possible to suppress layer discontinuity, ascribable to surface irregularities in the side surfaces of the ridge portion, in an insulating layer or electrode layer formed on the side surfaces of the ridge portion. It should be noted that, by suppressing layer discontinuity in the insulating layer or electrode layer, it is possible to suppress layer-discontinuity-induced inconveniences of current injection inhibition, current leakage, etc.

Moreover, according to the second aspect of the invention, by forming the semiconductor element layer formed on the substrate in such a way that it includes an etching marker layer, it is possible, in the etching for forming the ridge portion, to stop etching with reference to the etching marker layer. This helps reduce variations in the etching depth at the side of the ridge portion. Thus, it is possible to adjust to a desired distance the distance from the etching bottom surface to the active layer at the side of the ridge portion accurately, and it is thereby possible to suppress variations in the light confinement effect in the horizontal-lateral direction at the side of the ridge portion. This makes it possible to reduce fabrication variations in the light radiation angle in the horizontal direction.

In the above-described semiconductor laser chip according to the second aspect, preferably, the ridge portion is formed to make contact with a predetermined region on the etching marker layer. With this structure, by forming the etching marker layer at a desired position, it is possible to adjust to a desired distance the distance from the etching bottom surface to the active layer at the side of the ridge portion more accurately, and it is thereby possible to easily reduce variations in the light confinement effect in the horizontal-lateral direction at the side of the ridge portion. Thus, it is possible to suppress layer discontinuity and simultaneously easily reduce fabrication variations in the light radiation angle in the horizontal direction.

As described above, according to one aspect of the invention, it is possible to realize a method for forming a semiconductor laser chip that can suppress layer discontinuity and simultaneously reduce fabrication variations in the light radiation angle in the horizontal direction.

According to another aspect of the invention, it is possible to realize a semiconductor laser chip that can suppress layer discontinuity and simultaneously reduce fabrication variations in the light radiation angle in the horizontal direction.

DETAILED DESCRIPTION OF PREFERRED EMBODIMENTS

Hereinafter, how the invention is carried out will be described by way of embodiments with reference to the accompanying drawings.

Figure 1:
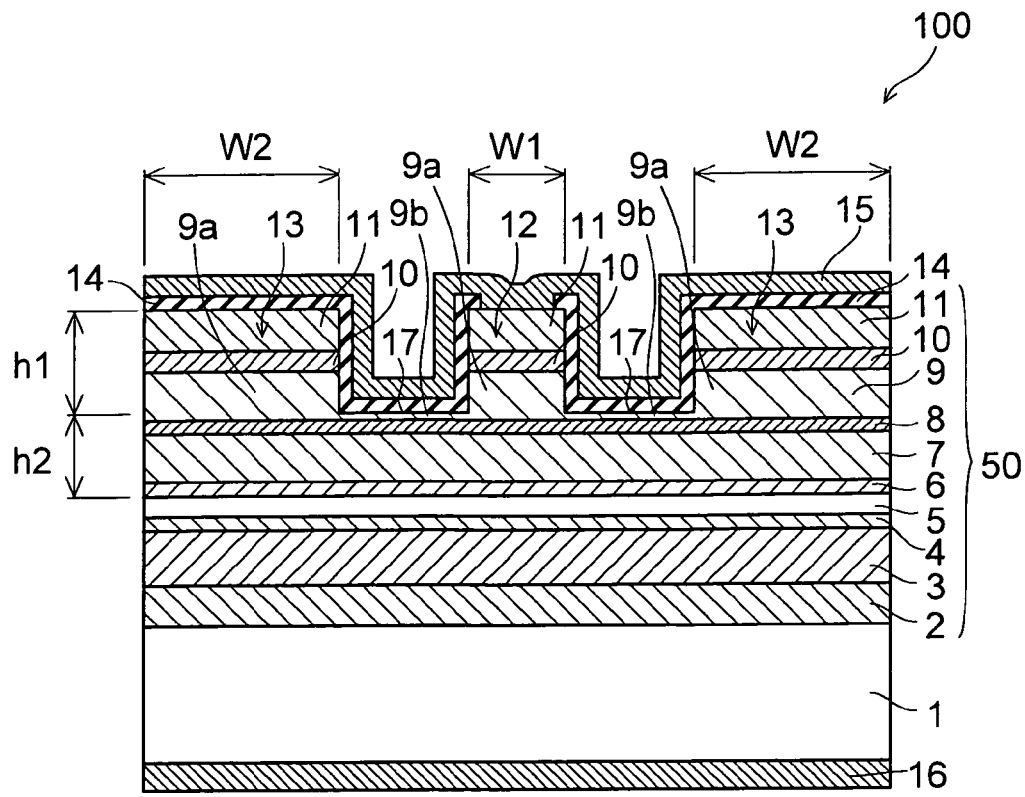
FIG. 1 is a sectional view showing the structure of a semiconductor laser chip according to a first embodiment of the invention.
Figure 2:
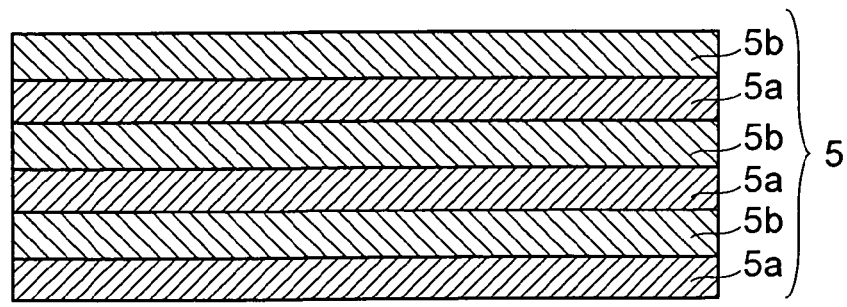
FIG. 2 is a sectional view showing the structure of the active layer of the semiconductor laser chip according to the first embodiment shown in FIG. 1.

First Embodiment: FIG. 1 is a sectional view showing the structure of a semiconductor laser chip according to a first embodiment of the invention. FIG. 2 is a sectional view showing the structure of the active layer of the semiconductor laser chip according to the first embodiment shown in FIG. 1. First, with reference to FIGS. 1 and 2, the structure of the semiconductor laser chip 100 according to the first embodiment of the invention will be described.

In the semiconductor laser chip 100 according to the first embodiment, on an n-type GaAs substrate 1 having a thickness of about 100 µm, a layer of n-GaAs having a thickness of about 500 nm is formed as a buffer layer 2. On the buffer layer 2, a layer of n-$Al_xGa_yIn_{1-x-y}P$ (where $0<x \leqq 1$ and $0<y \leqq 1$; hereinafter abbreviated to AlGaInP) having a thickness of about 2.8 µm is formed as a n-type clad layer 3. On the n-type clad layer 3, a layer of undoped AlGaInP having a thickness of about 35 nm is formed as a first light guide layer 4. On the first light guide layer 4, an active layer 5 having a MQW (multiple quantum well) structure is formed. As shown in FIG. 2, the active layer 5 is composed of the following layers laminated alternately: three quantum well layers 5a, of which each is a layer of GaInP having a thickness of about 5 nm; and three barrier layers 5b, of which each is a layer of AlGaInP having a thickness of about 6 nm. It should be noted that the n-type GaAs substrate 1 is an example of a "substrate" in the invention, and that the buffer layer 2, the n-type clad layer 3, the first light guide layer 4, and the active layer 5 are each an example of "a semiconductor layer" in the invention.

Moreover, as shown in FIG. 1, on the active layer 5, a layer of undoped AlGaInP having a thickness of about 35 nm is formed as a second light guide layer 6. On the second light guide layer 6, a layer of p-AlGaInP having a thickness of about 240 nm is formed as a p-type first clad layer 7. On the p-type first dad layer 7, a layer of GaInP having a thickness of about 10 nm is formed as an etching marker layer 8. The etching marker layer 8 has the function of allowing detection of the position (end position) at which to stop etching during formation of a ridge portion 12 and dummy ridge portion 13 in the formation process described later. It should be noted that the second light guide layer 6, the p-type first clad layer 7, and the etching marker layer 8 are each an example "a semiconductor layer" in the invention.

Here, in the first embodiment, on the etching marker layer 8, a ridge portion 12 and a pair of dummy ridge portions 13 are formed, each composed of an elevated portion 9a of a p-type second clad layer 9 (described later), an intermediate layer 10, and a contact layer 11. Formed as the p-type second clad layer 9 is a layer of p-AlGaInP that has three elevated portions 9a and, elsewhere than in the elevated portions 9a, flat portions 9b. The thickness of the flat portions 9b of the p-type second clad layer 9 is about 30 nm, and the height of the elevated portions 9a from the top surface of the flat portions 9b is about 1.17 µm. Formed as the intermediate layer 10 is a layer of p-GaInP having a thickness of about 35 µm. Formed as the contact layer 11 is a layer of p$^+$-GaAs having a thickness of about 500 nm. The ridge portion 12 is formed to be stripe-shaped (long, narrow) with a width W1 of about 1.7 µm, and the dummy ridge portions 13 are formed to be each stripe-shaped (long, narrow) with a width W2 of about 50 µm. Moreover, the dummy ridge portions 13 are formed with substantially the same height as the ridge portion 12, and are formed one to each side of the ridge portion 12 with an interval of about 15 µm from the ridge portion 12. Thus, the semiconductor laser chip 100 according to the first embodiment is formed to have a so-called double-channel structure.

Furthermore, on the top surface of the flat portions 9b of the p-type second clad layer 9, on the side surfaces of the ridge portion 12 and the dummy ridge portions 13, on part of the top surface of the ridge portion 12, and on the top surface of the dummy ridge portions 13, a layer of SiO$_2$ having a thickness of about 0.3 µm is formed as a current block layer 14. On the top surface of the current block layer 14 and on the exposed part of the top surface of the ridge portion 12, a p-side electrode 15 is formed, which is composed of the following layers laminated in the order named from the current block layer 14 side: a layer of AuZn having a thickness of about 100 nm; a layer of Ti having a thickness of about 150 nm; and a layer of Au having a thickness of about 50 nm. The AuZn layer has a composition ratio of Au:Zn=95 wt %:5 wt %. Moreover, on the bottom surface of the n-type GaAs substrate 1, an n-side electrode 16 is formed, which is composed of the following layers laminated in the order named from the bottom surface: a layer of AuGe having a thickness of about 150 nm; a layer of Ni having a thickness of about 150 nm; and a layer of Mo having a thickness of about 100 nm. The AuGe layer has a composition ratio of Au:Ge=88 wt %:12 wt %.

In the first embodiment, as described above, the ridge portion 12 is formed on the etching marker layer 8. Thus, even when, after the ridge portion 12 is formed, chemical etching (wet etching) is performed to remove reaction products produced during thy etching and parts damaged by etching, it is possible to suppress the inconvenience of, due to the difference between the etching speed at the etching marker layer 8 and the semiconductor layer around it, the etching marker layer 8 protruding from the side surfaces of the ridge portion 12 or receding from the side surfaces of the ridge portion 12. Thus, it is possible to suppress the inconvenience of, due to protrusion or recession of the etching marker layer 8, surface irregularities being produced in the side surfaces of the ridge portion 12. Thus, it is possible to suppress layer discontinuity in the current block layer 14 and the p-side electrode 15 formed in the side surfaces of the ridge portion 12 ascribable to surface irregularities in the side surfaces of the ridge portion 12. It should be noted that, by suppressing layer discontinuity in the current block layer 14 and the p-side electrode 15, it is possible to suppress layer-discontinuity-induced inconveniences of current injection inhibition, current leakage, etc. Moreover, in the semiconductor laser chip 100 according to the first embodiment, the dummy ridge portions 13 as a similar structure as the ridge portion 12. Thus, the dummy ridge portions 13 too offer an effect similar to the layer discontinuity suppressing effect offered by the ridge portion 12.

Moreover, in the first embodiment, the etching marker layer 8 is formed on the n-type GaAs substrate 1. Thus, in the etching for forming the ridge portion 12, it is possible to stop etching with reference to the etching marker layer 8. This helps reduce variations in the etching depth h1 (see FIG. 1) at both sides of the ridge portion 12. Thus, it is possible to adjust to a desired distance the distance h2 (see FIG. 1) from the etching bottom surface 17 to the active layer 5 at both sides of the ridge portion 12 accurately, and it is thereby possible to suppress variations in the light confinement effect in the horizontal-lateral direction at both sides of the ridge portion 12. This makes it possible to reduce fabrication variations in the light radiation angle in the horizontal direction.

FIGS. 3 to 13 are diagrams illustrating the formation process of the semiconductor laser chip according to the first embodiment shown in FIG. 1. Now, with reference to FIGS. 1 to 13, the formation process of the semiconductor laser chip 100 according to the first embodiment of the invention will be described.

Figure 3:
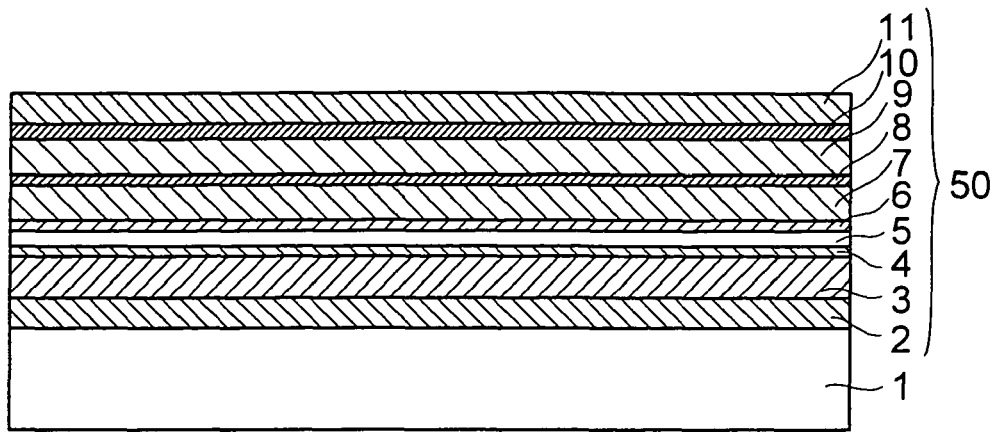
FIG. 3 is a sectional view illustrating the formation process of the semiconductor laser chip according to the first embodiment shown in FIG. 1.

First, as shown in FIG. 3, by MOCVD (metal organic chemical vapor deposition), on a semiconductor wafer having a diameter of three inches (the n-type GaAs substrate 1), the following layers are grown in the order named: the buffer layer 2, the n-type clad layer 3, the first light guide layer 4, the active layer 5, the second light guide layer 6, the p-type first clad layer 7, the etching marker layer 8, the p-type second clad layer 9, the intermediate layer 10, and the contact layer 11.

Specifically, on the top surface of the n-type GaAs substrate 1 having a thickness of about 450 µm, a layer of n-GaAs having a thickness of about 500 nm is grown as the buffer layer 2. Next, on the buffer layer 2, a layer of n-AlGaInP having a thickness of about 2.8 µm is grown as the n-type clad layer 3. Thereafter, on the n-type clad layer 3, a layer of undoped AlGaInP having a thickness of about 35 nm is grown as the first light guide layer 4.

Next, on the first light guide layer 4, as shown in FIG. 2, the active layer 5 having a MQW structure is formed by alternately growing three quantum well layers 5a, of which each is a layer of GaInP having a thickness of about 5 nm, and three barrier layers 5b, of which each is a layer of AlGaInP having a thickness of about 6 nm. Thereafter, as shown in FIG. 3, on the active layer 5, a layer of undoped AlGaInP having a thickness of about 35 nm is grown as the second light guide layer 6.

Subsequently, on the second light guide layer 6, a layer of p-AlGaInP having a thickness of about 240 nm is grown as the p-type first clad layer 7. Next, on the p-type first clad layer 7, a layer of GaInP having a thickness of about 10 nm is grown as the etching marker layer 8. Next, on the etching marker layer 8, a layer of p-AlGaInP having a thickness of about 1.2 µm is grown as the p-type second clad layer 9. Then, on the p-type second clad layer 9, a layer of p-GaInP having a thickness of about 500 nm is grown as the intermediate layer 10. Thereafter, on the intermediate layer 10, a layer of p$^+$-GaAs having a thickness of about 500 nm is grown as the contact layer 11. In this way, on the n-type GaAs substrate 1, an AlGaInP-based semiconductor element layer 50 is formed that is composed of the buffer layer 2, the n-type clad layer 3, the first light guide layer 4, the active layer 5, the second light guide layer 6, the p-type first clad layer 7, the etching marker layer 8, the p-type second clad layer 9, the intermediate layer 10, and the contact layer 11.

Figure 4:
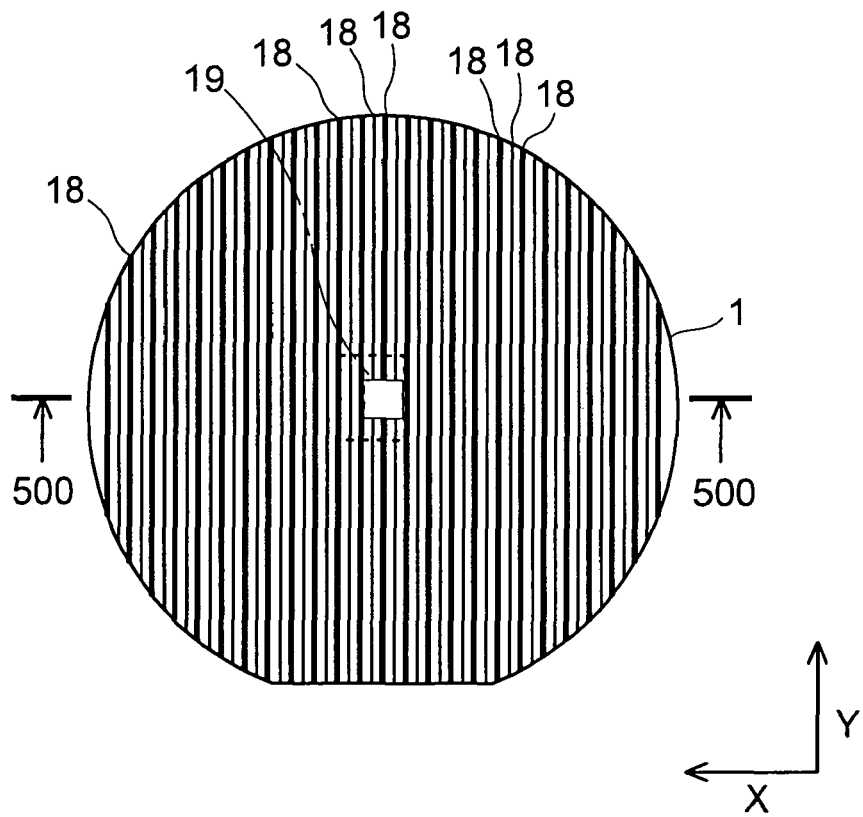
FIG. 4 is a plan view illustrating the formation process of the semiconductor laser chip according to the first embodiment shown in FIG. 1.
Figure 5:
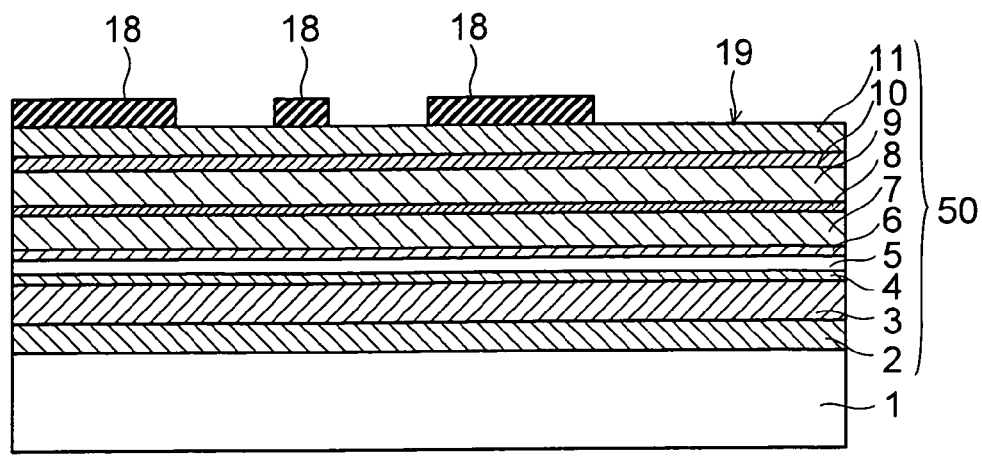
FIG. 5 is a sectional view, taken along line 500-500, of the region enclosed by broken lines in FIG. 4.

Next, as shown in FIGS. 4 and 5, on the top surface of the contact layer 11, by photolithography and etching, a layer of SiO$_2$ 18 having a thickness of about 20 nm is formed in stripe-shaped segments a predetermined interval (about 15 µm) apart from one another. Here, the SiO$_2$ layer 18 is formed in such a way that no part of it is located in the vicinity of a central part of the semiconductor wafer (the n-type GaAs substrate 1). Thus, in the vicinity of a central part of the semiconductor wafer, a depressed portion formation region 19 is provided in which a depressed portion 21 will be formed in a later step. As shown in FIG. 4, the depressed portion formation region 19 is formed in a square shape as seen in a plan view such that its dimensions in the directions indicated by arrows X and Y are each about 2 mm.

Figure 6:
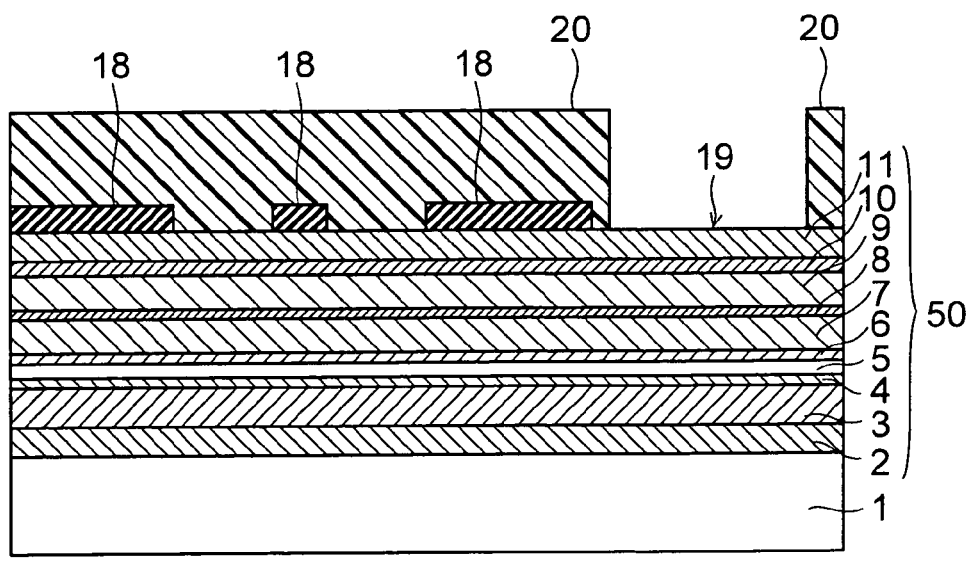
FIG. 6 is a sectional view illustrating the formation process of the semiconductor laser chip according to the first embodiment shown in FIG. 1.

Next, as shown in FIG. 6, a layer of photoresist 20 having a thickness of about 1.1 µm is formed except in the depressed portion formation region 19 in such a way as to cover the top surface of the contact layer 11 and the top and side surfaces of the SiO$_2$ layer 18. The photoresist 20 is an example of a "mask layer" and of "photosensitive resin in the invention.

Figure 7:
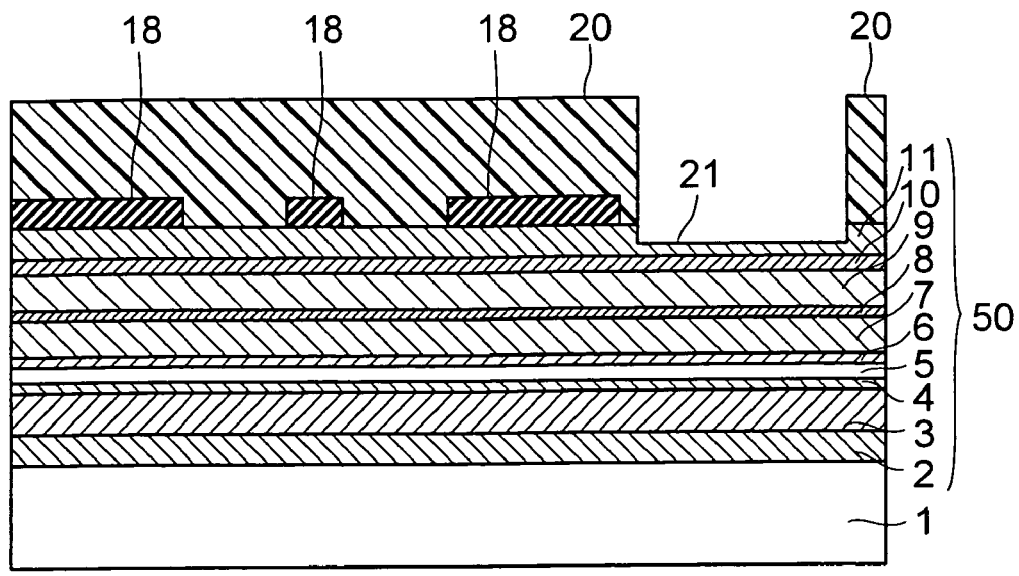
FIG. 7 is a sectional view illustrating the formation process of the semiconductor laser chip according to the first embodiment shown in FIG. 1.

Then, as shown in FIG. 7, by reactive ion etching using SiCl$_4$ gas, with the photoresist 20 serving as a mask, the depressed portion formation region 19 of the contact layer 11 is etched to form, in the contact layer 11, a depressed portion 21 having a depth of about 85 nm. The control of the depth of the depressed portion 21 is achieved by calculating, based on the previously measured etching speed of the contact layer 11, the time needed to etch a depth of about 85 nm and stopping etching when the so calculated time has passed.

Figure 8:
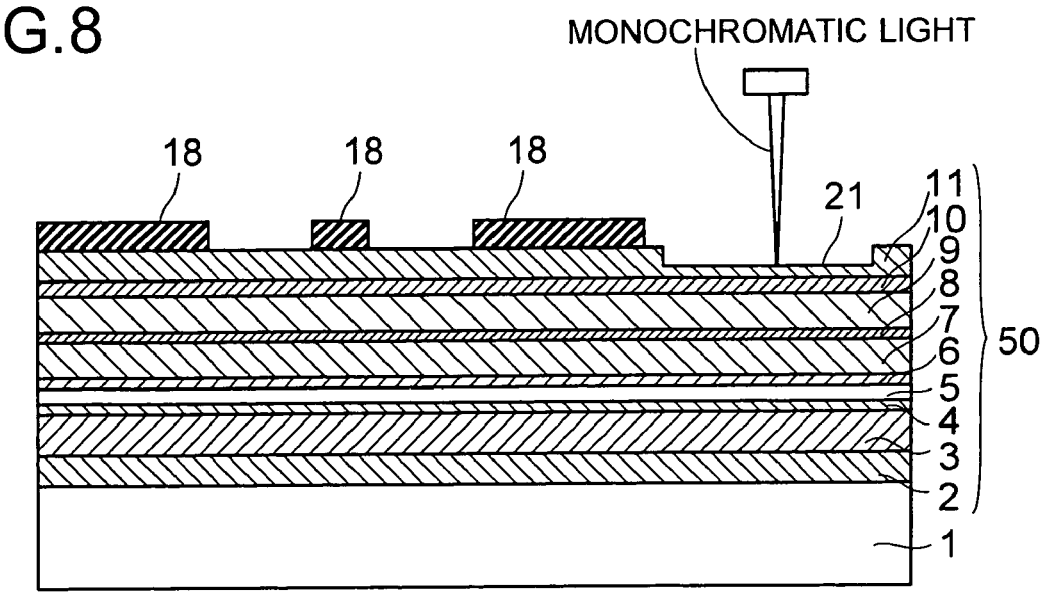
FIG. 8 is a sectional view illustrating the formation process of the semiconductor laser chip according to the first embodiment shown in FIG. 1.
Figure 9:
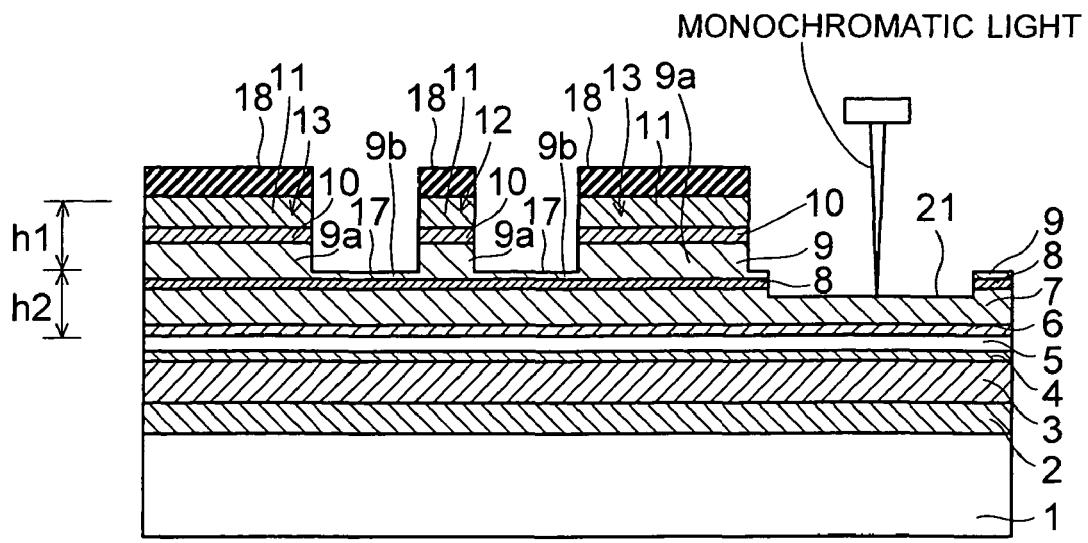
FIG. 9 is a sectional view illustrating the formation process of the semiconductor laser chip according to the first embodiment shown in FIG. 1.

Subsequently, as shown in FIG. 8, the photoresist 20 is removed with organic solvent, and then, as shown in FIG. 9, with the SiO$_2$ layer 18 serving as a mask, by reactive ion etching using chlorine-based gas such as Cl$_2$, SiCl$_4$, or BCl$_3$, the semiconductor element layer 50 is etched to form a ridge portion 12 and dummy ridge portions 13, each stripe-shaped and composed of the p-type second clad layer 9, the intermediate layer 10, and the contact layer 11.

Here, in the first embodiment, as shown in FIGS. 8 and 9, the etching for forming the ridge portion 12 and the dummy ridge portions 13 is achieved by shining light of a wavelength of 550 nm, that is, a wavelength shorter than the absorption edge of the etching marker layer 8, perpendicularly on the bottom region of the depressed portion 21 while monitoring the reflected light. In this case, when the etching depth at the depressed portion 21 reaches the etching marker layer 8, the absorption of light at the etching marker layer 8 changes, and accordingly the interference behavior of the reflected light changes. Thus, by detecting a change in the interference behavior of the reflected light, it is possible to check whether or not the etching depth at the depressed portion 21 has reached the etching marker layer 8.

Figure 10:
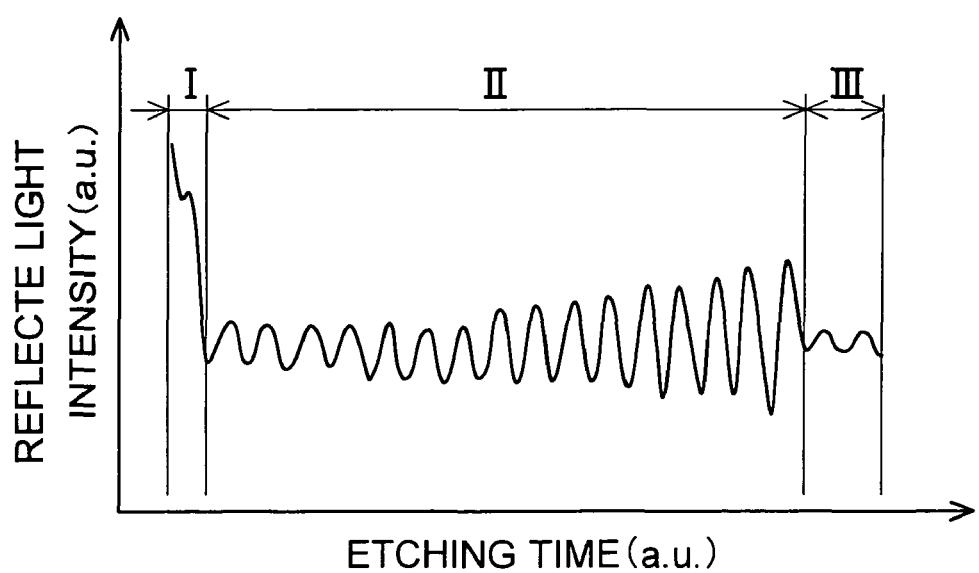
FIG. 10 is a graph showing the interference waveform of reflected light as observed during the etching for forming the ridge portion in the formation process of the semiconductor laser chip according to the first embodiment shown in FIG. 1.

FIG. 10 shows the interference waveform of the reflected light as observed during the etching for forming the ridge portion. In FIG. 10, region I corresponds to the period during which the contact layer 11 and the intermediate layer 10 are being etched, region II corresponds to the period during which the p-type second clad layer 9 is being etched, and region III corresponds to the period during which the p-type first clad layer 7 is being etched. Comparing the waveform in region II with that in region III in FIG. 10 reveals a great change in the width of variation of the interference waveform. This allows easy recognition of the end of the etching of the p-type second clad layer 9 and the transition to the etching of the p-type first clad layer 7. Thus, by detecting the time point of the transition to the etching of the p-type first clad layer 7, it is possible to indirectly detect that the etching depth has reached the etching marker layer 8. It should be noted that the etching marker layer 8 formed between the p-type second clad layer 9 and the p-type first clad layer 7 has a thickness as small as about 10 nm and is therefore, it has been found, difficult to detect directly.

Next, 10 seconds after the time point that, based on a change in the interference behavior of the reflected light being monitored, the etching depth at the depressed portion 21 is detected to have reached the etching marker layer 8, etching is stopped. Thus, as shown in FIG. 9, whereas in the bottom region of the depressed portion 21, etching proceeds beyond the etching marker layer 8 into the p-type first clad layer 7 under it, in the region where the depressed portion 21 is not formed, etching stops halfway in the p-type second clad layer 9, leaving the ridge portion 12 and the dummy ridge portions 13, each stripe-shaped, above the etching marker layer 8.

Specifically, etching proceeds until, in the region where the depressed portion 21 is not formed, the thickness of the flat portions 9b of the p-type second clad layer 9 at both sides of the ridge portion 12 and the dummy ridge portions 13 is about 30 nm. It should be noted that the above-described method of checking whether or not the etching depth has reached the etching marker layer 8 based on a change in the interference behavior of reflected light is an example of an "optical method" in the invention.

Next, etching in a solution of buffered fluoric acid at a temperature of about 15° C. is performed for 10 seconds to remove reaction products produced during, and parts damaged by, etching when the ridge portion 12 and the dummy ridge portions 13 were formed by dry etching.

Figure 11:
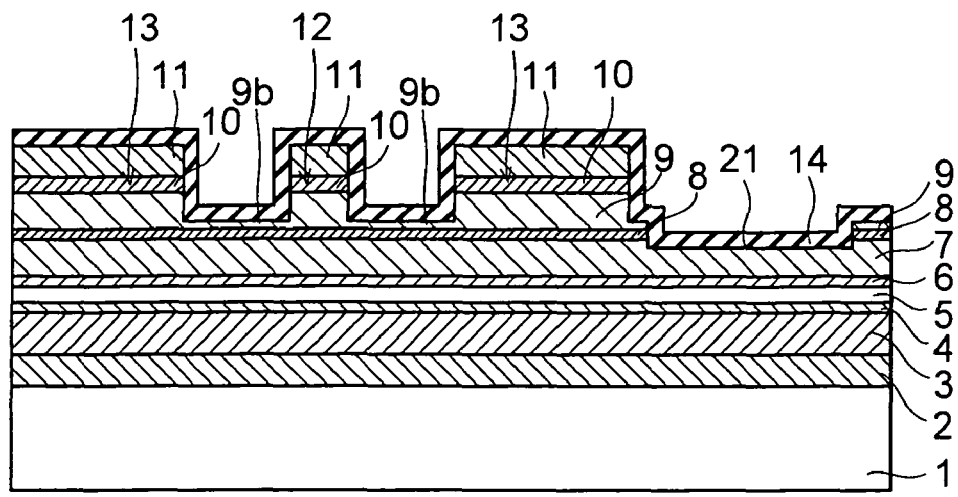
FIG. 11 is a sectional view illustrating the formation process of the semiconductor laser chip according to the first embodiment shown in FIG. 1.
Figure 12:
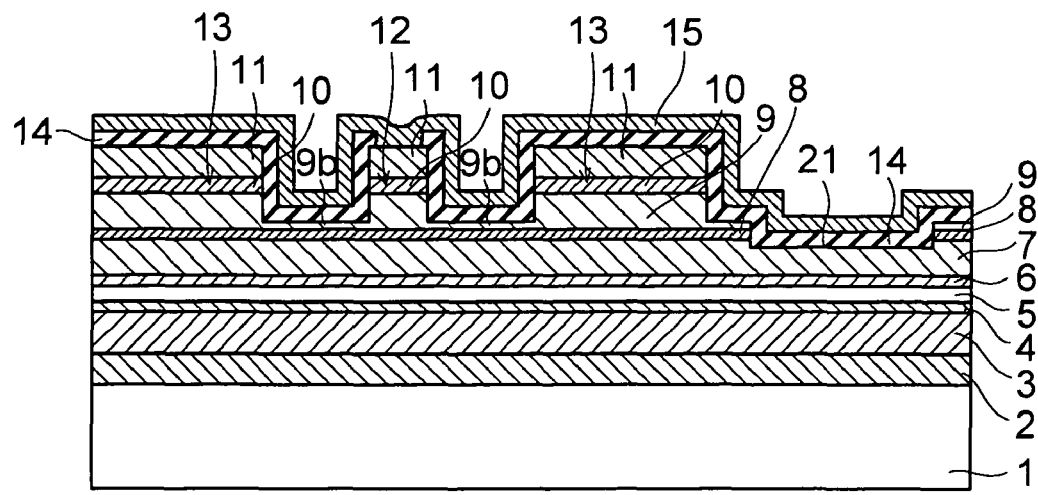
FIG. 12 is a sectional view illustrating the formation process of the semiconductor laser chip according to the first embodiment shown in FIG. 1.

Next, the SiO$_2$ layer 18 is removed, and then, as shown in FIG. 11, a layer of SiO$_2$ having a thickness of about 0.3 µm is formed as the current block layer 14 over the entire surface so as to cover the top surface of the flat portions 9b of the p-type second clad layer 9, the side surfaces of the ridge portion 12 and the dummy ridge portions 13, and the top surface of the ridge portion 12 and the dummy ridge portions 13. Then, as shown in FIG. 12, part of the top surface of the ridge portion 12 is exposed, and then the p-side electrode 15 is formed so as to cover the top surface of the current block layer 14 and the exposed part of the top surface of the ridge portion 12, the p-side electrode 15 being composed of the following layers laminated in the order named from the current block layer 14 side: a layer of AuZn (Au:Zn=95 wt %:5 wt %) having a thickness of about 100 nm; a layer of Ti having a thickness of about 150 nm, and a layer of Au having a thickness of about 50 nm.

Figure 13:
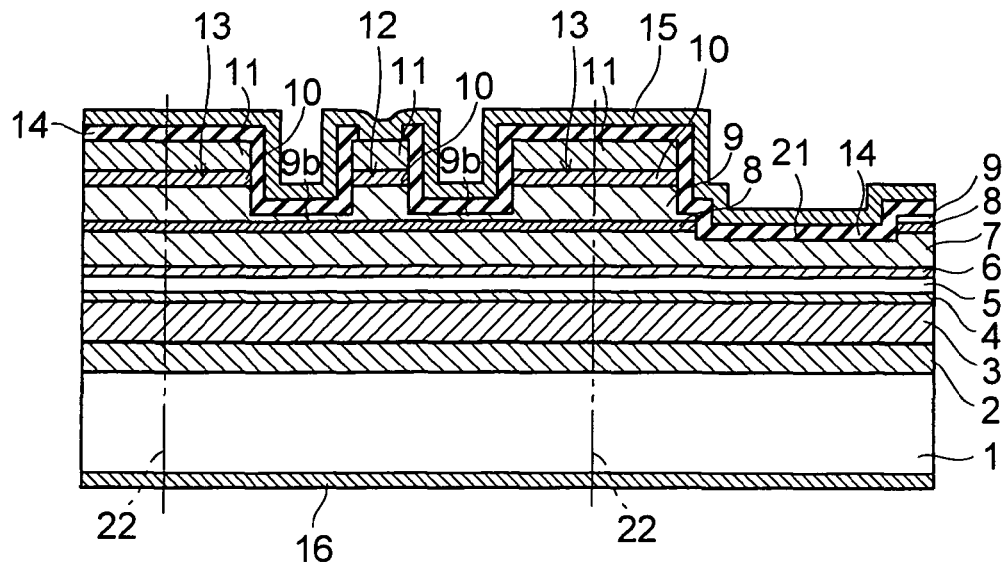
FIG. 13 is a sectional view illustrating the formation process of the semiconductor laser chip according to the first embodiment shown in FIG. 1.

Thereafter, the n-type GaAs substrate 1 is polished until it has a thickness of about 100 μm, and then, as shown in FIG. 13, on the bottom surface of the n-type GaAs substrate 1, the n-side electrode 16 is formed, which is composed of the following layers laminated in the order named from the side of the bottom surface of the n-type GaAs substrate 1: a layer of AuGe (Au:Ge=88 wt %:12 wt %) having a thickness of about 150 nm; a layer of Ni having a thickness of about 150 nm; and a layer of Mo having a thickness of about 100 nm. Lastly, the semiconductor wafer is split along splitting line 22 so that individual elements are separated from one another, each as a semiconductor laser chip 100. In this way, the semiconductor laser chip 100 according to the first embodiment of the invention shown in FIG. 1 is formed.

In the formation process of the semiconductor laser chip 100 according to the first embodiment, as described above, the depressed portion 21 having a depth of about 85 nm is formed in the contact layer 11, and, while the etching depth is being monitored in the bottom region of the depressed portion 21, the semiconductor element layer 50 is etched by dry etching. Thus, even when etching is stopped after the etching depth in the bottom region of the depressed portion 21 is detected to have reached the etching marker layer 8, it is possible to prevent the etching depth in the region where the depressed portion 21 is not formed from going beyond the etching marker layer 8. Specifically, since the etching marker layer 8 is set to have an extremely small thickness of about 10 nm, in the bottom region of the depressed portion 21, even when etching is stopped after the etching marker layer 8 is detected, etching proceeds beyond the etching marker layer 8 into the p-type first clad layer 7 under it. However, at the time point that the etching marker layer 8 is detected in the bottom region of the depressed portion 21, in the region where the depressed portion 21 is not formed, the etching depth has not reached the etching marker layer 8 yet. Thus, even when etching is stopped after the etching marker layer 8 is detected in the bottom region of the depressed portion 21, in the region where the depressed portion 21 is not formed, it is possible to suppress etching beyond the etching marker layer 8 into the p-type first clad layer 7 under it.

In this way, even when etching is stopped after the etching marker layer 8 is detected, it is possible to form the ridge portion 12 and the dummy ridge portions 13 without etching beyond the etching marker layer 8. Thus, even when, after the ridge portion 12 and the dummy ridge portions 13 are formed, etching in a solution of buffered fluoric acid at a temperature of about 15° C. is performed for 10 seconds to remove reaction products produced during dry etching and parts damaged by etching, in the region where the ridge portion 12 and the dummy ridge portions 13 are formed and where the depressed portion 21 is not formed, etching does not proceed beyond the etching marker layer 8 into the p-type first clad layer 7 under it. This helps suppress the inconvenience of, due to the differences between the etching speed at the etching marker layer 8 and that at the semiconductor layer around it, the etching marker layer 8 protruding from the side surfaces of the ridge portion 12 and the dummy ridge portions 13 or receding from the side surfaces of the ridge portion 12 and the dummy ridge portions 13. As a result, it is possible to suppress the inconvenience of, due to protrusion or recession of the etching marker layer 8, surface irregularities being produced in the side surfaces of the ridge portion 12 and the dummy ridge portions 13. Thus, when the current block layer 14 and the p-side electrode 15 are formed on the side surfaces of the ridge portion 12 and the dummy ridge portions 13, it is possible to suppress layer discontinuity in the current block layer 14 and the p-side electrode 15 ascribable to surface irregularities in the side surfaces of the ridge portion 12 and the dummy ridge portions 13. It should be noted that, by suppressing layer discontinuity in the current block layer 14 and the p-side electrode 15, it is possible, in the semiconductor laser chip 100 so formed, to suppress layer-discontinuity-induced inconveniences of current injection inhibition, current leakage, etc.

Moreover, in the first embodiment, the semiconductor element layer 50 including the etching marker layer 8 is formed on the n-type GaAs substrate 1, and the semiconductor element layer 50 is etched while the etching depth is monitored in the bottom region of the depressed portion 21 so that, after the etching marker layer 8 is detected, etching is stopped. This makes it possible to stop etching at a fixed position. Thus, by forming the etching marker layer 8 at the position where to stop etching, it is possible to stop etching accurately at a desired position, and it is thereby possible to suppress variations in the etching depth. That is, it is possible to enhance the controllability of etching. This makes it possible to adjust to a desired distance the distance h2 from the etching bottom surface 17 to the active layer 5 at both sides of the ridge portion 12, and thus it is possible to suppress variations in the light confinement effect in the horizontal-lateral direction at both sides of the ridge portion 12. As a result, it is possible to reduce fabrication variations in the light radiation angle in the horizontal direction in the semiconductor laser chip 100.

Moreover, in the first embodiment, when the ridge portion 12 is formed, light is shone on the bottom region of the depressed portion 21, and, by use of a method that detects that the depth of the depressed portion 21 has reached the etching marker layer 8 based on a change in the interference behavior of the reflected light, it is possible to easily detect that the depth of the depressed portion 21 has reached the etching marker layer 8. In addition, by stopping etching 10 seconds after the depth of the depressed portion 21 is detected to have reached the etching marker layer 8, it is possible to adjust more accurately to a depth not going beyond the etching marker layer 8 the etching depth in the region where the depressed portion 21 is not formed (the etching depth h1 at the side of the ridge portion 12). This makes it possible to reduce variations in the etching depth in the region where the depressed portion 21 is not formed (the etching depth h1 at the side of the ridge portion 12). That is, it is possible to easily enhance the controllability of etching.

Moreover, in the first embodiment, the depressed portion 21 is formed in the vicinity of a central part of the semiconductor wafer, and doing so, compared with forming the depressed portion 21 in the vicinity of an edge part of the semiconductor wafer, makes it possible to accurately control the etching depth in a case where etching is performed by dry etching. Specifically, in a case where etching is performed by dry etching, the etching depth tends to be greater in the vicinity of the edge part of the semiconductor wafer than the actual etching depth. Thus, by forming the depressed portion 21 in the vicinity of a central part of the semiconductor wafer, that is, the region of the semiconductor wafer other than the edge part thereof, it is possible to control the etching depth accurately during formation of the ridge portion 12.

Next, the experiments conducted to evaluate the effects of the first embodiment described above will be described. In the experiments, to evaluate the controllability of etching during formation of the ridge portion, the thickness of the flat portions of the p-type second clad layer at both sides of the ridge portion was measured. Used as Example 1 was the semiconductor laser chip 100 formed by the formation process described above. Used as an example for comparison (Comparative Example) was a semiconductor laser chip in which the etching depth during formation of the ridge portion was controlled, differently than in Example 1, by calculating, based on the previously measured etching speed, the time needed to etch a predetermined depth and stopping etching when the so calculated time passed. The thickness of the flat portions of the p-type second clad layer at both sides of the ridge portion was measured by use of a scanning electron microscope, by observing the reflection electronic image. Measurements were taken at 10 points each. The results are shown in Table 1.

TABLE 1

|  | Comparative Example | Example 1 |
| --- | --- | --- |
| Point 1 | 20.6 | 25.7 |
| Point 2 | 44.7 | 33.7 |
| Point 3 | 15.4 | 35.0 |
| Point 4 | 17.9 | 29.8 |
| Point 5 | 41.9 | 25.6 |
| Point 6 | 28.8 | 33.3 |
| Point 7 | 47.6 | 24.3 |
| Point 8 | 17.9 | 31.8 |
| Point 9 | 34.8 | 34.6 |
| Point 10 | 31.2 | 28.4 |
| Average | 30.0 | 30.0 |
| Standard Deviation | 12.0 | 4.0 |

Unit: nm

As Table 1 shows, comparing Example 1 with Comparative Example reveals that the former exhibits a smaller standard deviation than the latter. Specifically, in Comparative Example, in which the control of the etching depth was done based on the etching time, the standard deviation of the thickness of the flat portions of the p-type second clad layer at both sides of the ridge portion was 12 nm; by contrast, in Example 1, in which the etching depth was controlled by the formation process described above, the standard deviation of the thickness of the flat portions of the p-type second clad layer at both sides of the ridge portion was 4 nm, which was smaller than in Comparative Example. That is, variations in the thickness of the flat portions of the p-type second clad layer at both sides of the ridge portion was smaller in Example 1 than in Comparative Example.

Thus, the following has been confirmed: by adopting as a formation process for forming the semiconductor laser chip the formation process according to the first embodiment described above, it is possible to accurately control the thickness of the flat portions of the p-type second clad layer at both sides of the ridge portion, that is, it is possible to enhance the controllability of etching during formation of the ridge portion.

Figure 14:
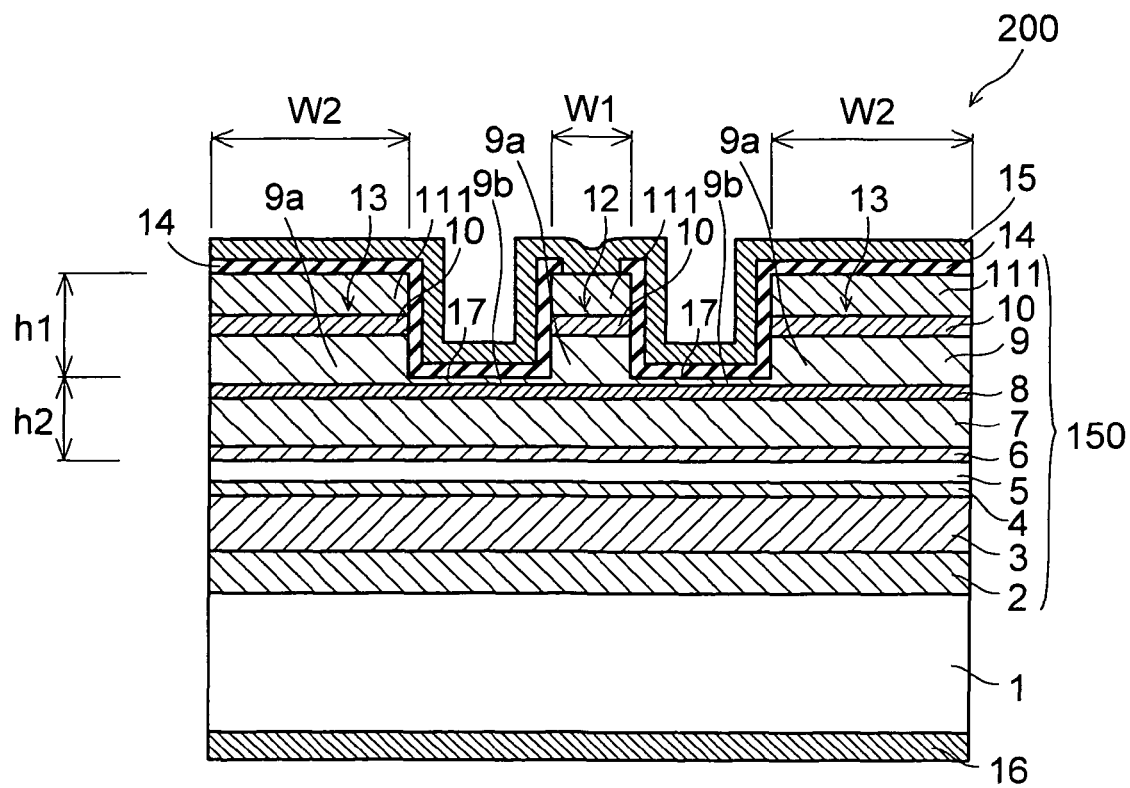
FIG. 14 is a sectional view showing the structure of a semiconductor laser chip according to a second embodiment of the invention.

Second Embodiment: FIG. 14 is a sectional view showing the structure of a semiconductor laser chip according to a second embodiment of the invention. With reference to FIG. 14, in the semiconductor laser chip 200 according to the second embodiment, as opposed to the structure of the first embodiment described above, the thickness of the contact layer 111 is 85 nm. Except in the thickness of the contact layer 111, the semiconductor laser chip 200 here has the same structure as the semiconductor laser chip 100 of the first embodiment described above, and accordingly no overlapping explanations will be repeated. The contact layer 111 is provided to secure ohmic contact between the p-side electrode 15 and the semiconductor element layer 150, and therefore modifying the thickness of the contact layer 111 to 85 nm does not affect the element characteristics of the semiconductor laser chip 200.

Figure 15:
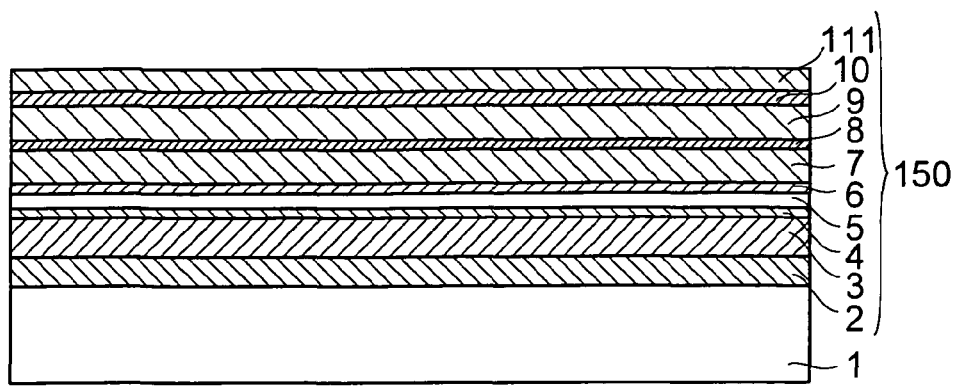
FIG. 15 is a sectional view illustrating the formation process of the semiconductor laser chip according to the second embodiment shown in FIG. 14.
Figure 16:
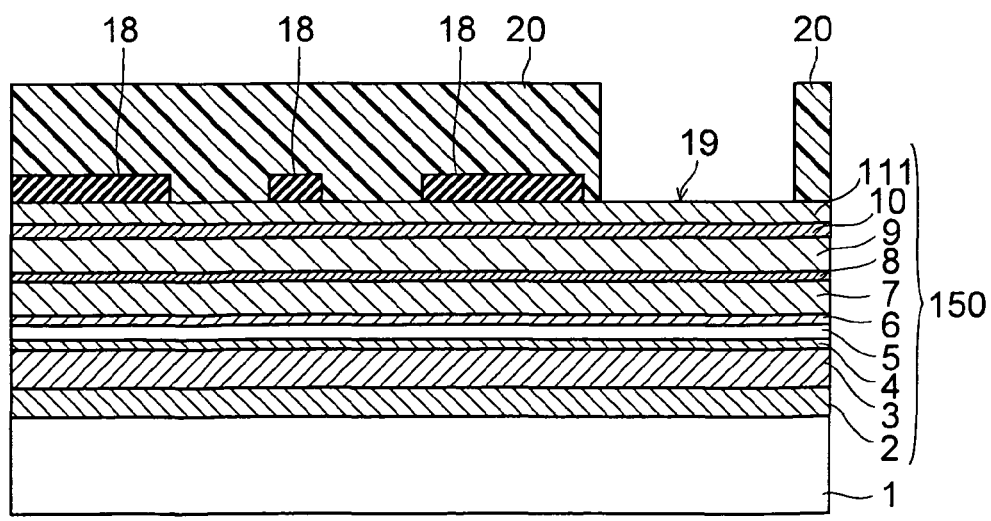
FIG. 16 is a sectional view illustrating the formation process of the semiconductor laser chip according to the second embodiment shown in FIG. 14.
Figure 17:
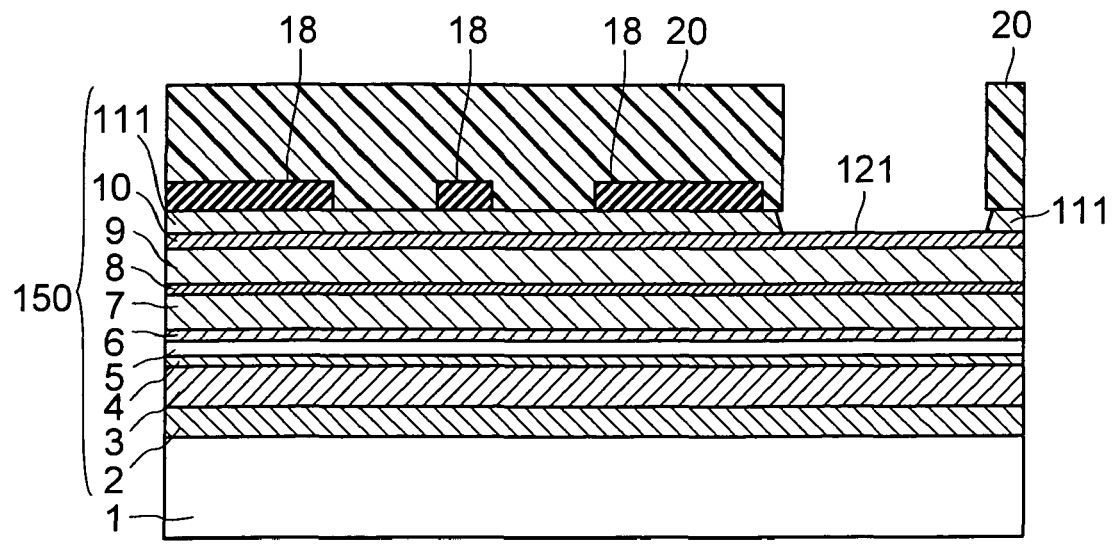
FIG. 17 is a sectional view illustrating the formation process of the semiconductor laser chip according to the second embodiment shown in FIG. 14.

FIGS. 15 to 17 are sectional views illustrating the formation process of the semiconductor laser chip according to the second embodiment shown in FIG. 14. Now, with reference to FIGS. 1, 3, 4, 9, 11, 12, and 14 to 17, the formation process of the semiconductor laser chip 200 according to the second embodiment will be described, taking up an example in which, as opposed to the formation process of the semiconductor laser chip 100 according to the first embodiment described above, the depressed portion 121 is formed by wet etching.

First, by a formation process similar to that of the first embodiment shown in FIG. 3, as shown in FIG. 15, on an n-type GaAs substrate 1, the following layers are laminated in the order named: a buffer layer 2, an n-type clad layer 3, a first light guide layer 4, an active layer 5, a second light guide layer 6, a p-type first clad layer 7, an etching marker layer 8, a p-type second clad layer 9, an intermediate layer 10, and a contact layer 111. Here, the contact layer 111 is formed to have a thickness of about 85 nm. In this way, on the n-type GaAs substrate 1, an AlGaInP-based semiconductor element layer 150 is formed that is composed of the buffer layer 2, the n-type clad layer 3, the first light guide layer 4, the active layer 5, the second light guide layer 6, the p-type first clad layer 7, the etching marker layer 8, the p-type second clad layer 9, the intermediate layer 10, and the contact layer 111

Next, by a formation process similar to that of the first embodiment shown in FIG. 4, on the top surface of the contact layer 111, a layer of $SiO_2$ 18 having a thickness of about 20 nm is formed in stripe-shaped segments a predetermined interval (about 15 μm) apart from one another. Here, the $SiO_2$ layer 18 is formed in such a way that no part of it is located in the vicinity of a central part of the semiconductor wafer. Thus, in the vicinity of a central part of the semiconductor wafer, a depressed portion formation region 19 is formed where the $SiO_2$ layer 18 is not formed. Thereafter, as shown in FIG. 16, a layer of photoresist 20 having a thickness of about 1.1 μm is formed except in the depressed portion formation region 19 in such a way as to cover the top surface of the contact layer 111 and the top and side surfaces of the $SiO_2$ layer 18.

Next, as shown in FIG. 17, by wet etching using a mixture liquid of sulfuric acid and aqueous hydrogen peroxide, with the photoresist 20 serving as a mask, the depressed portion formation region 19 of the contact layer 111 is etched. By the mixture liquid of sulfuric acid and aqueous hydrogen peroxide, the contact layer 111 is etched, but the intermediate layer 10 under it is hardly etched. Thus, the etching depth in the depressed portion formation region 19 is adjusted to be equal to the thickness (about 85 nm) of the contact layer 111. As a result, even when the etching speed at the contact layer 111 varies, etching in the depth direction stops as soon as the intermediate layer 10 is exposed, and this reduces variations in the depth of the depressed portion 121.

Incidentally, in a case where a mixture liquid of sulfuric acid and aqueous hydrogen peroxide is used, the reactivity of the mixture liquid may cause exfoliation at the interface between the photoresist 20 and the contact layer 111. To prevent this, it is effective to previously etch to a depth halfway into the contact layer 111 by dry etching before performing wet etching. Specifically, for example, first, by reactive ion etching using $SiCl_4$ gas, an about 50 nm is etched in the depth direction and then, by wet etching using a mixture liquid of sulfuric acid and aqueous hydrogen peroxide, the remaining about 35 nm is etched in the depth direction. In this way, when the contact layer 111 is etched by wet etching using a mixture liquid of sulfuric acid and aqueous hydrogen peroxide, it is possible to suppress exfoliation at the interface between the photoresist 20 and the contact layer 111, and it is thereby possible to form the depressed portion 121 more accurately.

Figure 18:
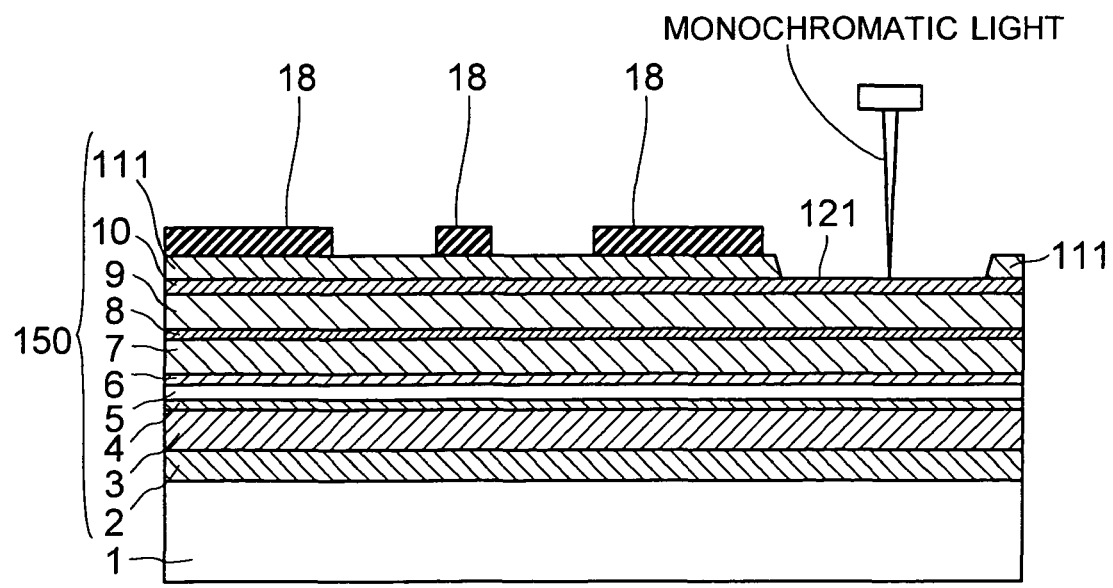
FIG. 18 is a sectional view illustrating the formation process of the semiconductor laser chip according to the second embodiment shown in FIG. 14.
Figure 19:
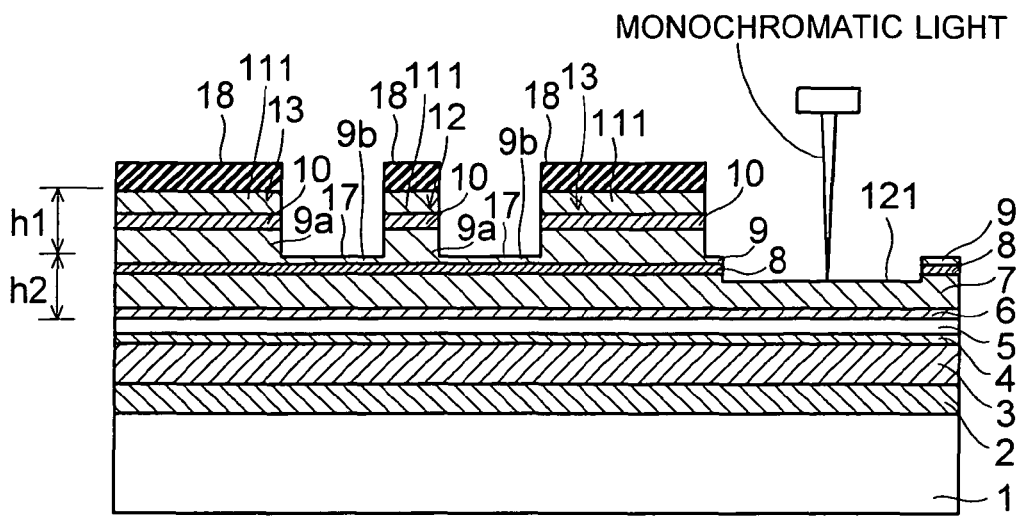
FIG. 19 is a sectional view illustrating the formation process of the semiconductor laser chip according to the second embodiment shown in FIG. 14.

Subsequently, as shown in FIG. 18, the photoresist 20 is removed, and then, by a formation process similar to that in the first embodiment shown in FIG. 9, as shown in FIG. 19, with the $SiO_2$ layer 18 serving as a mask, by reactive ion etching using chlorine-based gas such as $Cl_2$, $SiCl_4$, or $BCl_3$, the semiconductor element layer 150 is etched to form a ridge portion 12 and dummy ridge portions 13, each stripe-shaped and composed of the p-type second clad layer 9, the intermediate layer 10, and the contact layer 111.

Next, etching in a solution of buffered fluoric acid at a temperature of about 15° C. is performed for 10 seconds to remove reaction products produced during, and parts damaged by, etching when the ridge portion 12 and the dummy ridge portions 13 were formed by dry etching.

Then the $SiO_2$ layer 18 is removed, and then, by a formation process similar to that in the first embodiment shown in FIGS. 11 and 12, a current block layer 14 is formed over the entire surface so as to cover the top surface of the flat portions 9b of the p-type second clad layer 9, the side surfaces of the ridge portion 12 and the dummy ridge portions 13, and the top surface of the ridge portion 12 and the dummy ridge portions 13. Then, part of the top surface of the ridge portion 12 is exposed, and then a p-side electrode 15 is formed so as to cover the top surface of the current block layer 14 and the exposed part of the top surface of the ridge portion 12.

Next, the bottom surface of the n-type GaAs substrate 1 is polished until it has a thickness of about 100 μm, and then, by a formation process similar to that of the second embodiment shown in FIG. 13, an n-side electrode 16 is formed on the bottom surface of the n-type GaAs substrate 1. Lastly, the semiconductor wafer is split so that individual elements are separated from one another, each as a semiconductor laser chip 200. In this way, the semiconductor laser chip 200 according to the second embodiment of the invention shown in FIG. 14 is formed.

In the formation process of the semiconductor laser chip 200 according to the second embodiment, as described above, by forming the depressed portion 121 in the contact layer 111 by wet etching using a mixture liquid of sulfuric acid and aqueous hydrogen peroxide, it is possible to stop etching at the position where the intermediate layer 10 is exposed. That is, by the mixture liquid of sulfuric acid and aqueous hydrogen peroxide, the contact layer 111 is etched, but the intermediate layer 10 under the contact layer 111 is hardly etched. Thus, by wet etching using a mixture liquid of sulfuric acid and aqueous hydrogen peroxide, the depth of the depressed portion 121 can be adjusted to be equal to the thickness (about 85 nm) of the contact layer 111. Thus, by adjusting the thickness of the contact layer 111 to a desired thickness, even when the etching speed at the contact layer 111 varies, it is possible to adjust the depth of the depressed portion 121 accurately to a desired depth, and this helps reduce variations in the depth of the depressed portion 121. As a result, in the etching for forming the ridge portion 12, by stopping etching at a predetermined time point after (10 seconds after) the etching marker layer 8 is detected in the bottom region of the depressed portion 121, it is possible to also reduce variations in the etching depth in the region where the depressed portion 121 is not formed (the etching depth h1 (see FIG. 14) at the side of the ridge portion 12). In this way, it is possible to easily enhance the controllability of etching in the region where the depressed portion 121 is not formed, and it is thus possible to easily form the ridge portion 12 accurately without etching the etching marker layer 8 itself. As a result, it is possible to more easily suppress layer discontinuity and simultaneously reduce fabrication variations in the light radiation angle in the horizontal direction.

In other respects, the effects of the formation process of the second embodiment are similar to those of the first embodiment described previously.

Next, the results of measurement of the thickness of the flat portions 9b of the p-type second clad layer 9 at both sides of the ridge portion 12 in the semiconductor laser chip 200 formed as described above will be described. Here, the thickness of the flat portions 9b of the p-type second clad layer 9 was measured by a measurement method similar to that in the first embodiment (Example 1) described previously, and measurements were taken at 10 points. The semiconductor laser chip 200 according to the second embodiment is called Example 2, and its results are shown, together with the results of Example 1, in Table 2.

TABLE 2

|  | Example 1 | Example 2 |
| --- | --- | --- |
| Point 1 | 25.7 | 28.5 |
| Point 2 | 33.7 | 30.7 |
| Point 3 | 35.0 | 26.5 |
| Point 4 | 29.8 | 32.5 |
| Point 5 | 25.6 | 34.8 |
| Point 6 | 33.3 | 29.7 |
| Point 7 | 24.3 | 27.7 |
| Point 8 | 31.8 | 30.3 |
| Point 9 | 34.6 | 31.9 |
| Point 10 | 28.4 | 28.4 |
| Average | 30.0 | 30.0 |
| Standard Deviation | 4.0 | 2.5 |

Unit: nm

As Table 2 shows, comparing Example 2 with Example 1 reveals that the former exhibits a smaller standard deviation than the latter. Specifically, in Example 1, in which the control of the etching depth was done based on the etching time, the standard deviation of the thickness of the flat portions 9b of the p-type second clad layer 9 at both sides of the ridge portion 12 was 4 nm; by contrast, in Example 2, in which the depth of the depressed portion 121 was controlled by the formation process according to the second embodiment described above, the standard deviation of the thickness of the flat portions 9b of the p-type second clad layer 9 at both sides of the ridge portion 12 was 2.5 nm, which was even smaller than in Example 1. This owes to the fact that the formation process of the semiconductor laser chip 200 according to the second embodiment can control the depth of the depressed portion 121 accurately based on the thickness of the contact layer 111. Specifically, in the etching for forming the ridge portion 12, the time point at which to stop etching is determined with reference to the time point that the etching depth in the bottom region of the depressed portion 121 is detected to have reached the etching marker layer 8 based on a change in the interference behavior of the reflected light. Thus, by enhancing the controllability of the depth of the depressed portion 121, it is possible to control also the etching depth accurately in a later step, namely that of the etching for forming the ridge portion 12.

Thus, the following has been confirmed: by adopting as a formation process for forming the semiconductor laser chip the formation process according to the second embodiment described above, it is possible to more accurately control the thickness of the flat portions of the p-type second clad layer at both sides of the ridge portion, that is, it is possible to further enhance the controllability of etching during formation of the ridge portion.

Figure 20:
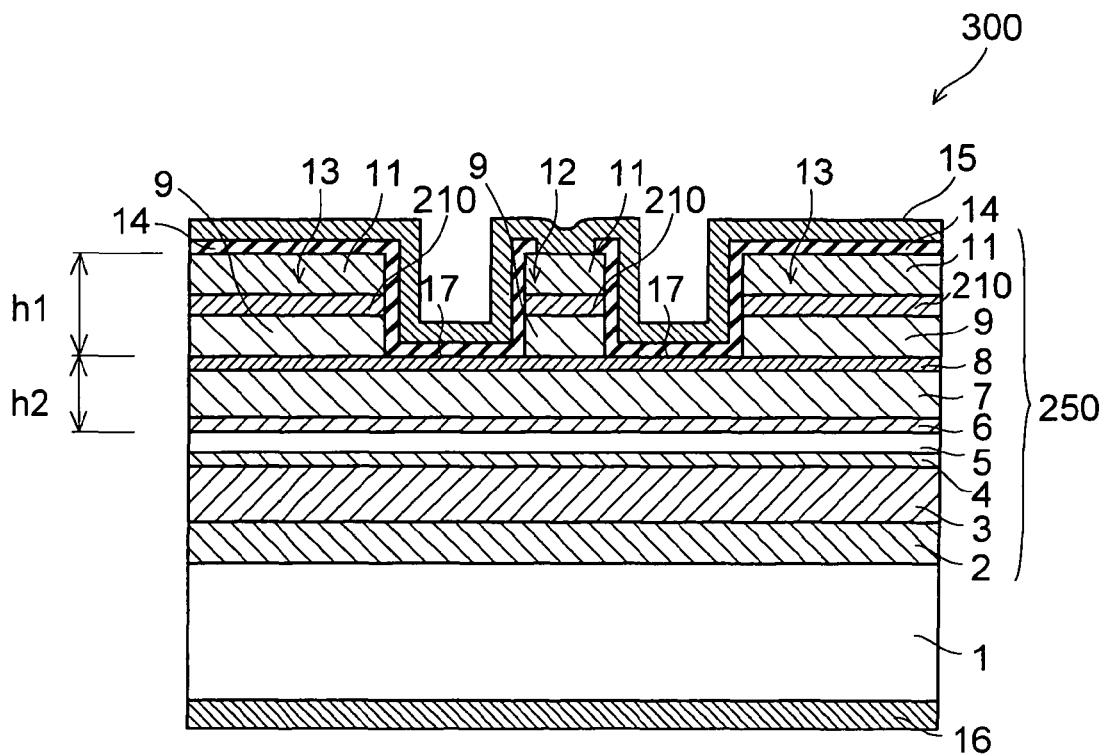
FIG. 20 is a sectional view showing the structure of a semiconductor laser chip according to a third embodiment of the invention.

Third Embodiment: FIG. 20 is a sectional view showing the structure of a semiconductor laser chip according to a third embodiment of the invention. Now, with reference to FIG. 20, the structure of the semiconductor laser chip 300 according to the third embodiment will be described.

In the semiconductor laser chip according to the third embodiment, as opposed to those of the first and second embodiments described previously, a ridge portion 12 and dummy ridge portions 13 are formed on an etching marker layer 8 so as to make contact therewith. The ridge portion 12 and the dummy ridge portions 13 are each composed of a p-type second clad layer 9, an intermediate layer 210, and a contact layer 11, and the etching bottom surface 17 at both sides of the ridge portion 12 lies on the top surface of the etching marker layer 8. Moreover, here, the intermediate layer 210, as opposed to those in the first and second embodiments described previously, is formed as a layer of p-GaInAsP. The intermediate layer 210 is, as in the first and second embodiments described previously, formed to have a thickness of about 35 nm.

In other respects, the structure of the third embodiment is similar to the structure of the first embodiment described previously.

In the third embodiment, as described above, the ridge portion 12 is formed on the etching marker layer 8 so as to make contact therewith. This makes it possible to form the etching marker layer 8 at a desired position and thereby adjust accurately to a desired distance the distance h2 from the etching bottom surface 17 at both sides of the ridge portion 12 to an active layer 5. Thus, it is possible to easily suppress variations in the light confinement effect in the horizontal-lateral direction at both sides of the ridge portion 12. In this way, it is possible to suppress layer discontinuity in the current block layer 14 and the p-side electrode 15 and simultaneously easily reduce fabrication variations in the light radiation angle in the horizontal direction.

In other respects, the effects of the third embodiment are similar to those of the first embodiment described previously.

FIGS. 21 to 24 are sectional views illustrating the formation process of the semiconductor laser chip according to the third embodiment shown in FIG. 20. Now, with reference to FIGS. 3 to 9, 11 to 13, and 20 to 24, the formation process of the semiconductor laser chip 300 according to the third embodiment will be described, taking up an example in which, as opposed to the formation process of the semiconductor laser chip 100 according to the first embodiment described previously, after the wet etching for forming the ridge portion 12, etching is performed by wet etching.

Figure 21:
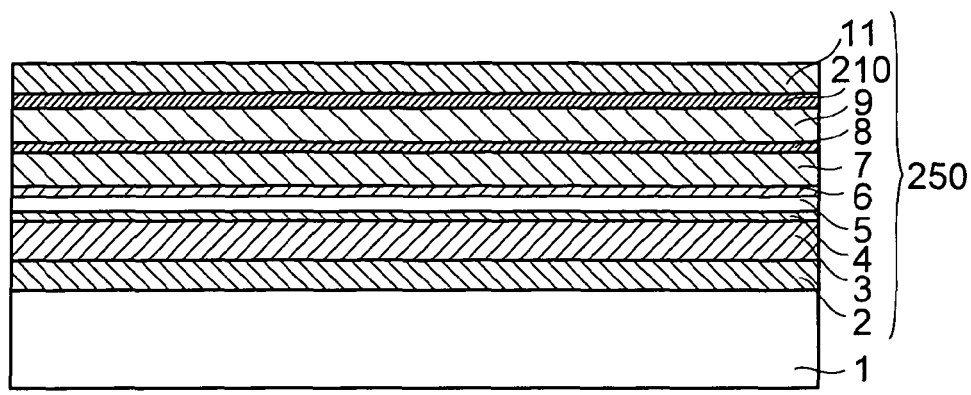
FIG. 21 is a sectional view illustrating the formation process of the semiconductor laser chip according to the third embodiment shown in FIG. 20.

First, by a formation process similar to that of the first embodiment shown in FIG. 3, as shown in FIG. 21, on an n-type GaAs substrate 1, the following layers are laminated in the order named: a buffer layer 2, an n-type clad layer 3, a first light guide layer 4, an active layer 5, a second light guide layer 6, a p-type first clad layer 7, an etching marker layer 8, a p-type second clad layer 9, an intermediate layer 210, and a contact layer 11. Here, the intermediate layer 210 is formed of GaInAsP. In this way, on the n-type GaAs substrate 1, an AlGaInP-based semiconductor element layer 250 is formed that is composed of the buffer layer 2, the n-type clad layer 3, the first light guide layer 4, the active layer 5, the second light guide layer 6, the p-type first clad layer 7, the etching marker layer 8, the p-type second clad layer 9, the intermediate layer 210, and the contact layer 11. Except the intermediate layer 210, these layers 2 to 11 are similar in composition and thickness to the layer 2 to 11 in the first embodiment.

Figure 22:
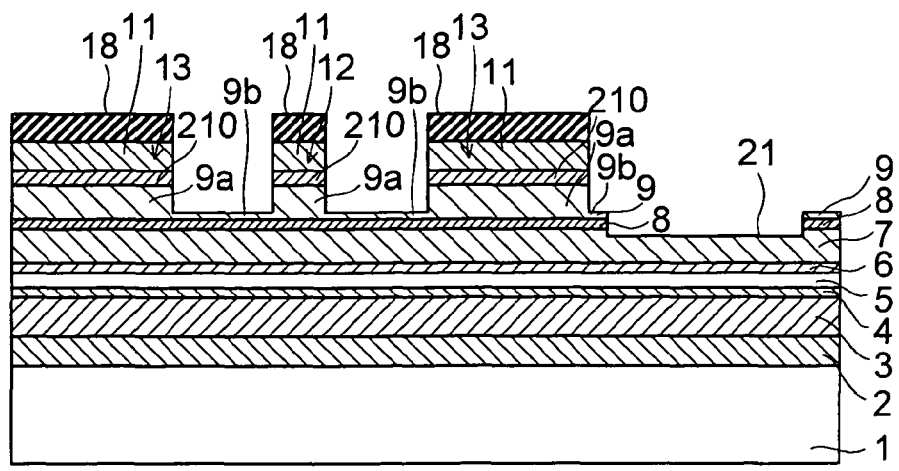
FIG. 22 is a sectional view illustrating the formation process of the semiconductor laser chip according to the third embodiment shown in FIG. 20.

Next, by a formation process similar to that of the first embodiment shown in FIGS. 4 to 9, a ridge portion 12 and dummy ridge portions 13 are formed. FIG. 22 shows the ridge portion 12 and the dummy ridge portions 13 so formed. In the state shown in FIG. 22, the ridge portion 12 and the dummy ridge portions 13 are composed of elevated portions 9a of the p-type second clad layer 9, the intermediate layer 210, and the contact layer 11. Thus, the etching bottom surface 17 at both sides of the ridge portion 12 is formed halfway in the p-type second clad layer 9, so that the p-type second clad layer 9 has elevated portions 9a and, elsewhere than in the elevated portions 9a, flat portions.

Next, etching in a solution of buffered fluoric acid at a temperature of about 15° C. is performed for 10 seconds to remove reaction products produced during, and parts damaged by, etching when the ridge portion 12 and the dummy ridge portions 13 were formed by dry etching.

Figure 23:
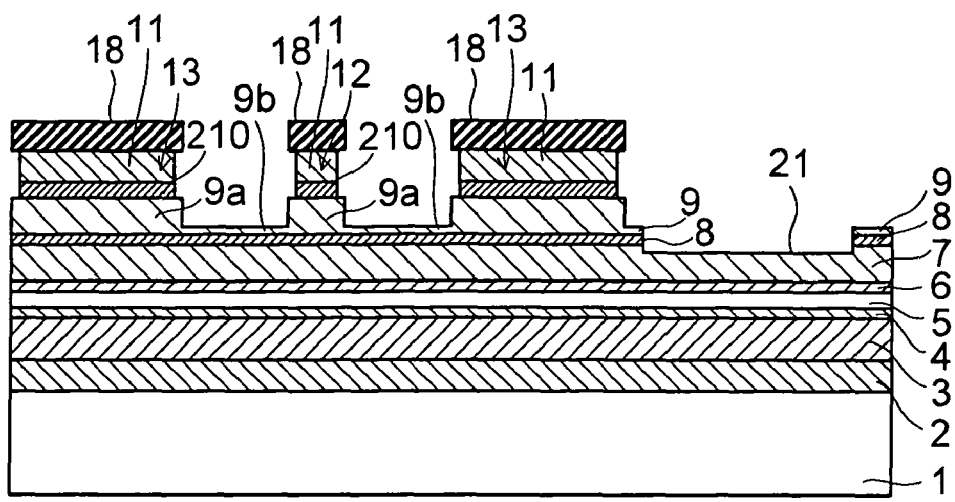
FIG. 23 is a sectional view illustrating the formation process of the semiconductor laser chip according to the third embodiment shown in FIG. 20.

Subsequently, by wet etching using a mixture liquid of sulfuric acid and aqueous hydrogen peroxide, as shown in FIG. 23, the contact layer 11 and the intermediate layer 210 are etched. By the mixture liquid of sulfuric acid and aqueous hydrogen peroxide, the p-type second clad layer 9 is hardly etched, and thus the width of upper parts (the contact layer 11 and the intermediate layer 210) of the ridge portion 12 and the dummy ridge portions 13 diminishes.

Figure 24:
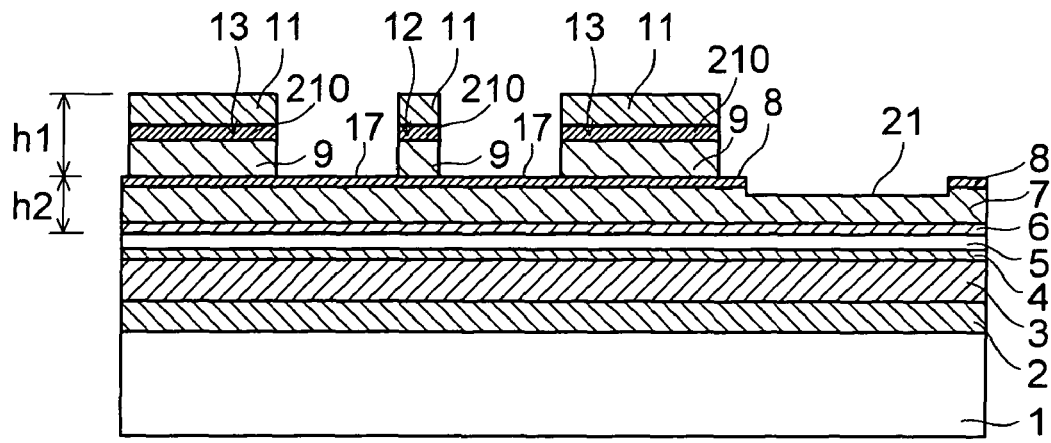
FIG. 24 is a sectional view illustrating the formation process of the semiconductor laser chip according to the third embodiment shown in FIG. 20.
Figure 25:
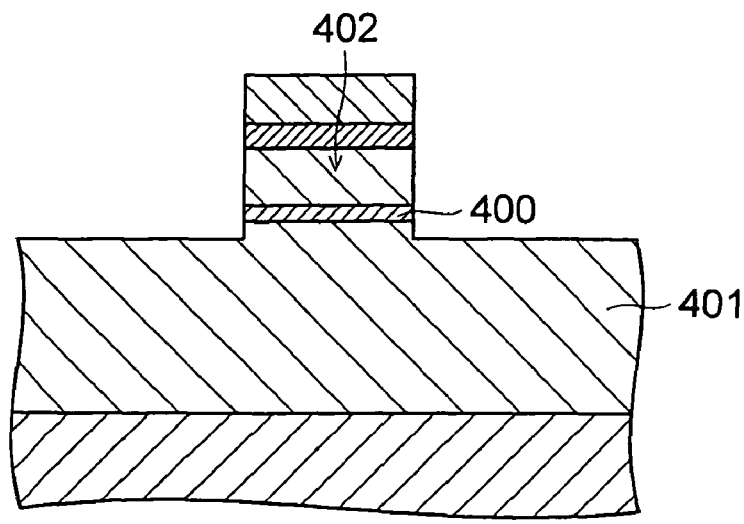
FIG. 25 is a schematic sectional view illustrating the ridge portion formed by the conventional formation process disclosed in Non-patent Document 1.
Figure 26:
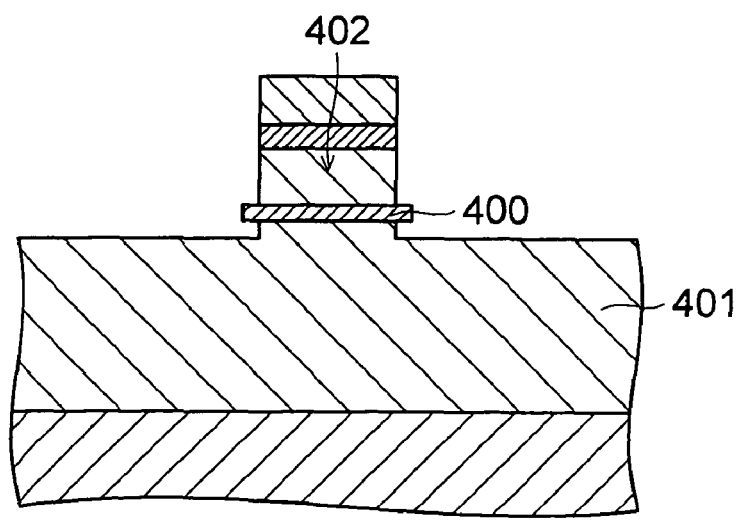
FIG. 26 is a schematic sectional view illustrating the ridge portion formed by the conventional formation process disclosed in Non-patent Document 1.
Figure 27:
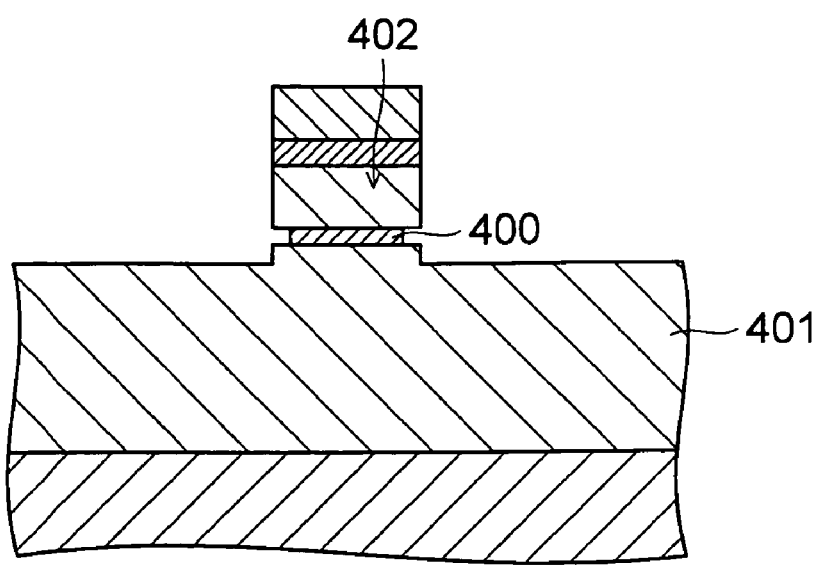
FIG. 27 is a schematic sectional view illustrating the ridge portion formed by the conventional formation process disclosed in Non-patent Document 1.

Next, by wet etching using a solution of fluoric acid, as shown in FIG. 24, the p-type second clad layer 9 is etched. Here, the SiO$_2$ layer 18 is also etched and is completely removed. By the solution of fluoric acid, the p-type second clad layer 9 is etched, but the etching marker layer 8, the contact layer 11, and the intermediate layer 210 are hardly etched. Thus, as the flat portions 9b of the p-type second clad layer 9 are removed, the width of lower parts (the p-type second clad layer 9) of the ridge portion 12 and the dummy ridge portions 13 is adjusted to be substantially equal to that of their upper parts (the contact layer 11 and the intermediate layer 210). In this way, through a step of two-stage wet etching, it is possible to form on the top surface of the etching marker layer 8 the etching bottom surface 17 at both sides of the ridge portion 12.

Subsequently, by a formation process similar to that in the first embodiment shown in FIGS. 11 and 12, a current block layer 14 is formed over the entire surface so as to cover the side surfaces of the ridge portion 12 and the dummy ridge portions 13 and the top surface of the ridge portion 12 and the dummy ridge portions 13. Then, part of the top surface of the ridge portion 12 is exposed, and then a p-side electrode 15 is formed so as to cover the top surface of the current block layer 14 and the exposed part of the top surface of the ridge portion 12.

Next, the bottom surface of the n-type GaAs substrate 1 is polished until it has a thickness of about 100 µm, and then, by a formation process similar to that of the first embodiment shown in FIG. 13, an n-side electrode 16 is formed on the bottom surface of the n-type GaAs substrate 1. Lastly, the semiconductor wafer is split so that individual elements are separated from one another, each as a semiconductor laser chip 300. In this way, the semiconductor laser chip 300 according to the third embodiment of the invention shown in FIG. 20 is formed.

In the formation process of the semiconductor laser chip according to the third embodiment, as described above, in the step of forming the ridge portion 12, after the semiconductor element layer 250 is etched by dry etching, the semiconductor element layer 250 is further etched through two-stage wet etching consisting of wet etching using a mixture liquid of sulfuric acid and aqueous hydrogen peroxide and wet etching using a solution of buffered fluoric acid. In this way, the etching for forming the ridge portion 12 can be stopped at the position of the top surface of the etching marker layer 8. That is, the etching bottom surface 17 at both sides of the ridge portion 12 can be formed at the top surface of the etching marker layer 8. Thus, the distance h2 from the etching bottom surface 17 to the active layer 5 can be controlled based solely on the thicknesses of the p-type first clad layer 7 and the etching marker layer 8. Since the p-type first clad layer 7 and the etching marker layer 8 can be formed accurately to have predetermined thicknesses during crystal growth, the distance h2 from the etching bottom surface 17 to the active layer 5 can be controlled accurately to be a desired distance. Thus, it is possible to more easily suppress variations in the light confinement effect at both sides of the ridge portion 12, and thus it is possible to more easily enhance the controllability of the light radiation angle in the horizontal direction in the semiconductor laser chip 300.

Moreover, in the third embodiment, before the step of etching by wet etching, by use of the formation process according to the first embodiment described previously, it is possible to control the etching by dry etching with high accuracy. Thus, the etching by dry etching can be stopped accurately immediately before reaching the etching marker layer 8, which has the function of stopping the etching by wet etching. As a result, it is possible to minimize the thickness of the flat portions 9b of the p-type second clad layer 9 as observed after completion of the etching by dry etching, and thus it is possible to minimize the time required by the etching by wet etching. In this way, in the etching by wet etching, it is possible to minimize etching that proceeds in the horizontal direction (width direction) of the ridge portion 12, and it is thereby possible to minimize the diminishing of the width of the ridge portion 12. Consequently, it is possible to reduce variations in the degree of diminishing of the width of the ridge portion 12, and it is thereby possible to suppress variations, due to variations in the width of the ridge portion 12, in the element characteristics, such as kink suppression effect and threshold current level, of the semiconductor laser chip.

In a case where the etching by dry etching is performed by use of the commonly known method of calculating, based on the previously measured etching speed, the time needed to etch a desired depth and stopping etching when the so calculated time has passed, consideration needs to be given to the fact that the thickness of the semiconductor layers (the contact layer 11, the intermediate layer 210, and the p-type second clad layer 9) to be removed by etching varies in the crystal growth process, and accordingly etching needs to be performed shallowly enough to leave an ample margin such that, even that thickness is minimal, the etching depth will not go beyond the p-type second clad layer 9. This inconveniently leads to a large thickness of the flat portions 9b of the p-type second clad layer 9 on completion of the etching by dry etching, and hence to long time required by the etching by wet etching. As a result, inconveniently, in the etching by wet etching, etching proceeds far in the horizontal direction (width direction) of the ridge portion 12, resulting in large variations in the width of the ridge portion 12. This inconveniently increases variations in the element characteristics, such as kink suppression effect and threshold current level, of the semiconductor laser chip.

In other respects, the effects of the formation process of the third embodiment are similar to those of the first embodiment described previously.

It should be understood that the embodiments disclosed herein are in all respects merely examples of and are in no way meant to limit how the invention is carried out. The scope of the invention should be determined not with reference to the explanations of the embodiments described above but in view of the scope of the appended claims, and should be understood to include any modifications within the significance and range equivalent to those of the claims.

For example, although the first to third embodiments described above deal with examples in which the semiconductor laser chip is formed as an AlGaInP-based semiconductor element layer, this is not meant to limit the invention; the semiconductor laser chip may instead be formed as a group II-IV semiconductor element layer such as a Ze—Se-base one, an InP-based semiconductor laser chip, a GaAs-based semiconductor element layer, or the like.

Although the first to third embodiments described above deal with examples in which the individual layers constituting the semiconductor element layer are formed by crystal growth using MOCVD, this is not meant to limit the invention; the crystal growth may instead be achieved by any other method of crystal growth, such as MOVPE, MBE (molecular beam epitaxial growth), or the like.

Although the first to third embodiments described above deal with examples in which the semiconductor laser chip is formed to have a so-called double-channel structure, this is not meant to limit the invention; the semiconductor laser chip may instead be so structured as to have a ridge portion alone.

Although the first to third embodiments described above deal with examples in which etching by dry etching is achieved by use of reactive ion etching, this is not meant to limit the invention; the etching may instead be achieved by use of dry etching other than reactive ion etching. Examples of dry etching other than reactive ion etching include reactive ion beam etching, inductively coupled plasma etching, and ECR plasma etching.

Although the first to third embodiments described above deal with examples that adopt a method of shining light on the bottom region of the depressed portion and detecting that the etching depth at the depressed portion has reached the etching marker layer based on a change in the interference behavior of the reflected light, this is not meant to limit the invention; any method other than the one just described may instead be used so long as it can detect that the etching depth at the depressed portion has reached the etching marker layer. Examples of methods other than the one just described include the following one: the wavelength spectrum of plasma light emission during dry etching is monitored and, after completion of the etching of the p-AlGaInP layer formed as the p-type second clad layer, at the start of the etching of the etching marker layer, a variation in the light emission peak ascribable to the etching of Al is captured, and thereby the etching depth is detected to have reached the etching marker layer.

Although the first to third embodiments described above deal with examples in which monochromatic light of a wavelength of 550 nm is used as the light for detecting the etching marker layer, this is not meant to limit the invention; any monochromatic light, such as laser light, having a wavelength other than 550 nm may instead be used so long as it allows detection of the etching marker layer. Although the description above deals with examples in which the etching marker layer is formed as a GaInP layer, it may instead be formed as a semiconductor layer other than a GaInP layer.

Although the first to third embodiments described above deal with examples in which etching is stopped 10 seconds after the etching depth at the depressed portion is detected to have reached the etching marker layer based on a change in the interference behavior in the reflected light, this is not meant to limit the invention; etching may instead be stopped at any time point other than 10 seconds after so long as the time point is before the etching depth in the region where the depressed portion is not formed reaches the etching marker layer.

Although the first to third embodiments described above deal with examples in which one depressed portion is formed in the semiconductor wafer, this is not meant to limit the invention; a plurality of depressed portions may instead be formed in the semiconductor wafer. Although the description above deals with examples in which the depressed portion is formed in the vicinity of a central part of the semiconductor wafer, this is not meant to limit the invention; the depressed portion may instead be formed elsewhere than in the vicinity of a central part of the semiconductor wafer.

Although the first embodiment described above deals with an example in which photoresist is removed with organic solvent, this is not meant to limit the invention; photoresist may instead be removed by plasma processing involving electric discharge in a dry etching machine (vacuum machine) having oxygen introduced into it. With this configuration, the series of steps including formation of the depressed portion, removal of the photoresist, and formation of the ridge portion can all be performed continuously in a dry etching machine (vacuum machine), and thus the whole processing can be performed in a single vacuum machine. This helps shorten the processing time. Moreover, performing the series of steps continuously in a dry etching machine (vacuum machine) helps reduce the occasion of the semiconductor element layer being exposed to the atmosphere, and thus helps suppress formation of an oxide film on the surface of the semiconductor element layer. In this way, it is possible to suppress the inconvenience of the fabrication yields of the semiconductor element layer lowering due to formation of an oxide film on the surface of the semiconductor element layer. Moreover, removing photoresist by plasma processing, as opposed to removing photoresist by a wet process, helps suppress deposition of minute amounts of residues on the surface of the semiconductor element layer. Thus, in the etching process for forming the ridge portion, it is possible to suppress the inconvenience of the flatness of the surface of the semiconductor element layer worsening due to such residues. This too helps suppress lowering of the fabrication yields of the semiconductor laser chip. Incidentally, removal of photoresist by ashing using radical oxygen may be achieved by a method other than oxygen plasma processing, for example ozone decomposition.

Although the second embodiment described above deals with an example in which the contact layer is formed to have a thickness of about 85 nm, this is not meant to limit the invention; the contact layer may instead be formed to have a thickness other than about 85 nm. The aim of the contact layer being formed to have a thickness of about 85 nm is to adjust the depth of the depressed portion to the depth of the depressed portion according to the first embodiment described above.

Although the third embodiment described above deals with an example in which the formation process according to the first embodiment is used before the step of etching by wet etching, this is not meant to limit the invention; instead, the formation process according to the second embodiment may be used before the step of etching by wet etching. With this configuration, it is possible to control the etching by dry etching with high accuracy. Thus, the etching by dry etching can be stopped more accurately immediately before reaching the etching marker layer, which has the function of stopping the etching by wet etching. In this way, in the etching by wet etching, it is possible to minimize etching that proceeds in the horizontal direction (width direction) of the ridge portion, and it is thus possible to easily suppress variations, due to variations in the width of the ridge portion, in the element characteristics, such as kink suppression effect and threshold current level, of the semiconductor laser chip.

What is claimed is:

1. A method for forming a semiconductor laser chip, comprising:
    a step of forming, on a substrate, a semiconductor element layer comprising a plurality of semiconductor layers including an etching marker layer;
    a step of forming, in a predetermined region in the semiconductor element layer, a depressed portion having a predetermined depth not reaching the etching marker layer; and
    a step of forming a ridge portion in the semiconductor element layer by etching the semiconductor element layer by dry etching while monitoring etching depth in a bottom region of the depressed portion,
    wherein the step of forming the ridge portion includes
       a step of detecting, by an optical method, that the depth of the depressed portion has reached the etching marker layer; and
       a step of stopping etching at a predetermined time point after detecting
       that the depth of the depressed portion has reached the etching marker layer but before etching depth in a region of the semiconductor element layer where the depressed portion is not formed reaches the etching marker layer.

2. The method according to claim 1, wherein the step of forming the depressed portion includes:
    a step of forming a mask layer on the region of the semiconductor element layer where the depressed portion is not formed and etching the semiconductor element layer with the mask layer serving as a mask.

3. The method according to claim 2, wherein the step of etching the semiconductor element layer with the mask layer serving as a mask includes:
    a step of etching the semiconductor element layer by dry etching.

4. The method according to claim 3, wherein the mask layer is formed of photosensitive resin, and
    wherein the step of etching the semiconductor element layer with the mask layer serving as a mask includes:
    a step of removing the mask layer by ashing using radical oxygen.

5. The method according to claim 2, wherein the step of etching the semiconductor element layer with the mask layer serving as a mask includes:
    a step of etching the semiconductor element layer by wet etching.

6. The method according to claim 5, wherein the step of forming the depressed portion further includes:
    a step of, prior to the step of etching the semiconductor element layer by wet etching, etching the semiconductor element layer by dry etching.

7. The method according to claim 1, wherein the step of forming the ridge portion includes:
    a step of, after etching the semiconductor element layer by dry etching, further etching the semiconductor element layer by wet etching.

8. The method according to claim 1, wherein the semiconductor element layer is formed on a semiconductor wafer, and wherein the step of forming the depressed portion further includes:

a step of forming, as the depressed portion, one or more depressed portions in vicinity of a central part of the semiconductor wafer.

9. A semiconductor laser chip comprising:

a semiconductor element layer formed on a substrate and comprising a plurality of semiconductor layers including an etching marker layer and a first layer formed on the etching marker layer;

a ridge portion formed by etching the semiconductor element layer; and at least one etched portion formed adjacent to the ridge portion;

wherein the ridge portion is formed on the etching marker layer, and wherein the base of the etched portion is above the etching marker layer and a portion of the first layer.

10. The semiconductor according to claim 9, wherein the ridge portion is formed to make contact with a predetermined region on the etching marker layer.

* * * * *